US012700805B2

(12) United States Patent
Yamane et al.

(10) Patent No.: US 12,700,805 B2
(45) Date of Patent: Aug. 4, 2026

(54) INTEGRATED CIRCUIT HAVING DYNAMIC SWITCHING CONTROL AND POWER SUPPLY CIRCUIT INCLUDING THE SAME

(71) Applicant: FUJI ELECTRIC CO., LTD.,
Kawasaki (JP)

(72) Inventors: Hiroki Yamane, Matsumoto-city (JP);
Shinji Matsumoto, Matsumoto-city
(JP)

(73) Assignee: FUJI ELECTRIC CO., LTD.,
Kawasaki (JP)

( * ) Notice: Subject to any disclaimer, the term of this patent is extended or adjusted under 35 U.S.C. 154(b) by 316 days.

(21) Appl. No.: 18/493,156

(22) Filed: Oct. 24, 2023

(65) Prior Publication Data

US 2024/0186880 A1     Jun. 6, 2024

(30) Foreign Application Priority Data

Dec. 6, 2022     (JE) ................................. 2022-194967
Mar. 3, 2023     (JP) ................................. 2023-032592

(51) Int. Cl.
*H02M 3/335*       (2006.01)
*H02M 1/00*        (2006.01)
*H03K 17/78*       (2006.01)
(52) U.S. Cl.
CPC ..... *H02M 3/33523* (2013.01); *H02M 1/0035* (2021.05); *H03K 17/78* (2013.01)

(58) Field of Classification Search
CPC .............................................. H02M 3/335–42
See application file for complete search history.

(56) References Cited

U.S. PATENT DOCUMENTS

| | | | | |
|---|---|---|---|---|
| 10,312,816 B1 * | 6/2019 | Zhao | ...................... | H02M 3/156 |
| 2013/0308791 A1 * | 11/2013 | Yang | .................... | H04B 15/005 381/94.5 |
| 2016/0373011 A1 * | 12/2016 | Kawashima | ............ | H02M 1/32 |
| 2017/0288553 A1 * | 10/2017 | Fahlenkamp | ..... | H02M 3/33523 |

FOREIGN PATENT DOCUMENTS

| | | |
|---|---|---|
| JP | 2022-025944 A | 2/2022 |
| JP | 2022-084503 A | 6/2022 |

* cited by examiner

*Primary Examiner* — Peter M Novak
(74) *Attorney, Agent, or Firm* — Rabin & Berdo, P.C.

(57)     ABSTRACT
An integrated circuit for a power supply circuit generating an output voltage of a target level from an input voltage. The integrated circuit includes: a first oscillator circuit configured to output a first oscillator signal having a first frequency corresponding to the output voltage; a second oscillator circuit configured to output a second oscillator signal having a predetermined second frequency; and a driver circuit configured to drive a transistor of the power supply circuit, in response to the first oscillator signal, after the target level of the output voltage is changed to a first level, and drive the first transistor in response to the second oscillator signal, after the target level is changed to a second level lower than the first level, and a control circuit configured to stop an operation of the first oscillator circuit, after the target level is changed to the second level.

15 Claims, 20 Drawing Sheets

Vosc

Ss

Sdrv

Va   0V

Vb

Vc   0V

Vcs   VREF0
        Vfb

|    | IN | SH1 | SH1b | Vn0 | SH2 | SL0 | 237 | 238 | OUT |
|----|----|-----|------|-----|-----|-----|-----|-----|-----|
| P0 | L | L | H | L | L | H | OFF | ON | GND |
| P1 | H | H | L | H | H | L | ON | OFF | Vcc |
| P2 | L | L | L | Hi-Z | L | L | OFF | OFF | Hi-Z |

FIG. 12

INTEGRATED CIRCUIT HAVING DYNAMIC SWITCHING CONTROL AND POWER SUPPLY CIRCUIT INCLUDING THE SAME

CROSS-REFERENCE TO RELATED APPLICATION

The present application claims the benefit of priority to Japanese Patent Application Nos. 2022-194967 and 2023-032592, filed Dec. 6, 2022 and Mar. 3, 2023, respectively, of which full contents are incorporated herein by reference.

BACKGROUND

Technical Field

The present disclosure relates to an integrated circuit and a power supply circuit.

Description of the Related Art

Some AC-DC converters are configured to lower the target level of the output voltage thereof, in response to a load entering a light load condition. In such an AC-DC converter, the output voltage is lowered by decreasing the switching frequency of a transistor that controls an inductor current flowing through a primary coil of a transformer, for example (e.g., Japanese Patent Application Publication Nos. 2022-084503 and 2022-025944).

However, even if the output voltage is lowered to thereby lower the power consumption of the AC-DC converter, switching of the transistor is controlled by the same method as that in a normal case. Accordingly, it has been difficult to achieve sufficiently low power consumption of the integrated circuit configured to control the switching of the transistor.

SUMMARY

A first aspect of the present disclosure is an integrated circuit for a power supply circuit configured to generate an output voltage of a target level from an input voltage thereof, the target level being changeable between a first level and a second level lower than the first level, the power supply circuit including a transformer including a primary coil, a secondary coil, and an auxiliary coil, and a first transistor configured to control a current flowing through the primary coil, the integrated circuit being configured to drive the first transistor, the integrated circuit comprising: a first oscillator circuit configured to output a first oscillator signal having a first frequency corresponding to the output voltage; a second oscillator circuit configured to output a second oscillator signal having a predetermined second frequency; a driver circuit configured to drive the first transistor in response to the first oscillator signal, after the target level of the output voltage is changed to the first level, and drive the first transistor in response to the second oscillator signal, after the target level is changed to the second level; and a control circuit configured to stop an operation of the first oscillator circuit, after the target level is changed to the second level.

A second aspect of the present disclosure is a power supply circuit configured to generate an output voltage from an input voltage thereof, the power supply circuit comprising: a transformer including a primary coil, a secondary coil, and an auxiliary coil; a first transistor configured to control a current flowing through the primary coil; and an integrated circuit configured to drive the first transistor and to perform control such that the output voltage reaches a target level, the target level being changeable between a first level and a second level lower than the first level, the integrated circuit including a first oscillator circuit configured to output a first oscillator signal having a first frequency corresponding to the output voltage, a second oscillator circuit configured to output a second oscillator signal having a predetermined second frequency, a driver circuit configured to drive the first transistor in response to the first oscillator signal, after the target level of the output voltage is changed to the first level, and drive the first transistor in response to the second oscillator signal, after the target level is changed to the second level, and a control circuit configured to stop an operation of the first oscillator circuit, after the target level is changed to the second level.

A third aspect of the present disclosure is an integrated circuit for a power supply circuit configured to generate an output voltage of a target level from an input voltage thereof, the target level being changeable between a first level and a second level lower than the first level, the power supply circuit including a transformer including a primary coil, a secondary coil, and an auxiliary coil, and a first transistor configured to control a current flowing through the primary coil, the integrated circuit being configured to drive the first transistor, the integrated circuit comprising: a determination circuit configured to determine whether driving of the first transistor is stopped, based on the output voltage; an oscillator circuit configured to output an oscillator signal; a driving signal output circuit configured to output a driving signal to turn on the first transistor in response to the oscillator signal, and output the driving signal to turn off the first transistor, in response to a voltage corresponding to a current flowing through the first transistor when the first transistor is on reaching a voltage corresponding to the output voltage; a buffer circuit configured to stop the driving of the first transistor, in response to the determination circuit determining that the driving of the first transistor is stopped, and drive the first transistor, based on the driving signal, in response to the determination circuit determining that the driving of the first transistor is not stopped; and a control circuit configured to operate the buffer circuit after the target level is changed to the first level, and stop an operation of the buffer circuit, in response to the determination circuit determining that the driving of the first transistor is stopped, after the target level is changed to the second level.

A fourth aspect of the present disclosure is a power supply circuit configured to generate an output voltage from an input voltage thereof, the power supply circuit comprising: a transformer including a primary coil, a secondary coil, and an auxiliary coil; a first transistor configured to control a current flowing through the primary coil; and an integrated circuit configured to drive the first transistor and to perform control such that the output voltage reaches a target level, the target level being changeable between a first level and a second level lower than the first level, the integrated circuit including a determination circuit configured to determine whether driving of the first transistor is stopped, based on the output voltage, an oscillator circuit configured to output an oscillator signal, a driving signal output circuit configured to output a driving signal to turn on the first transistor in response to the oscillator signal, and output the driving signal to turn off the first transistor, in response to a voltage corresponding to a current flowing through the first transistor when the first transistor is on reaching a voltage corresponding to the output voltage, a buffer circuit configured to stop the driving of the first transistor, in response the determination circuit determining that the driving of the first transistor is stopped, and drive the first transistor, based on the driving signal, in response to the determination circuit determining that the driving of the first transistor is not stopped, and a control circuit configured to operate the buffer circuit, after the target level is changed to the first level, and stop an operation of the buffer circuit, in response to the determination circuit determining that the driving of the first transistor is stopped, after the target level is changed to the second level.

BRIEF DESCRIPTION OF THE DRAWINGS

FIG. 8 is a chart illustrating an example of main waveforms of an AC-DC converter 10 and a control IC 42.

FIG. 12 is a chart illustrating an example of an input/output relationship of a buffer circuit 81.

DETAILED DESCRIPTION

At least following matters will become apparent from the descriptions of the present specification and the accompanying drawings.

Embodiments of the Present Disclosure

Figure 1:
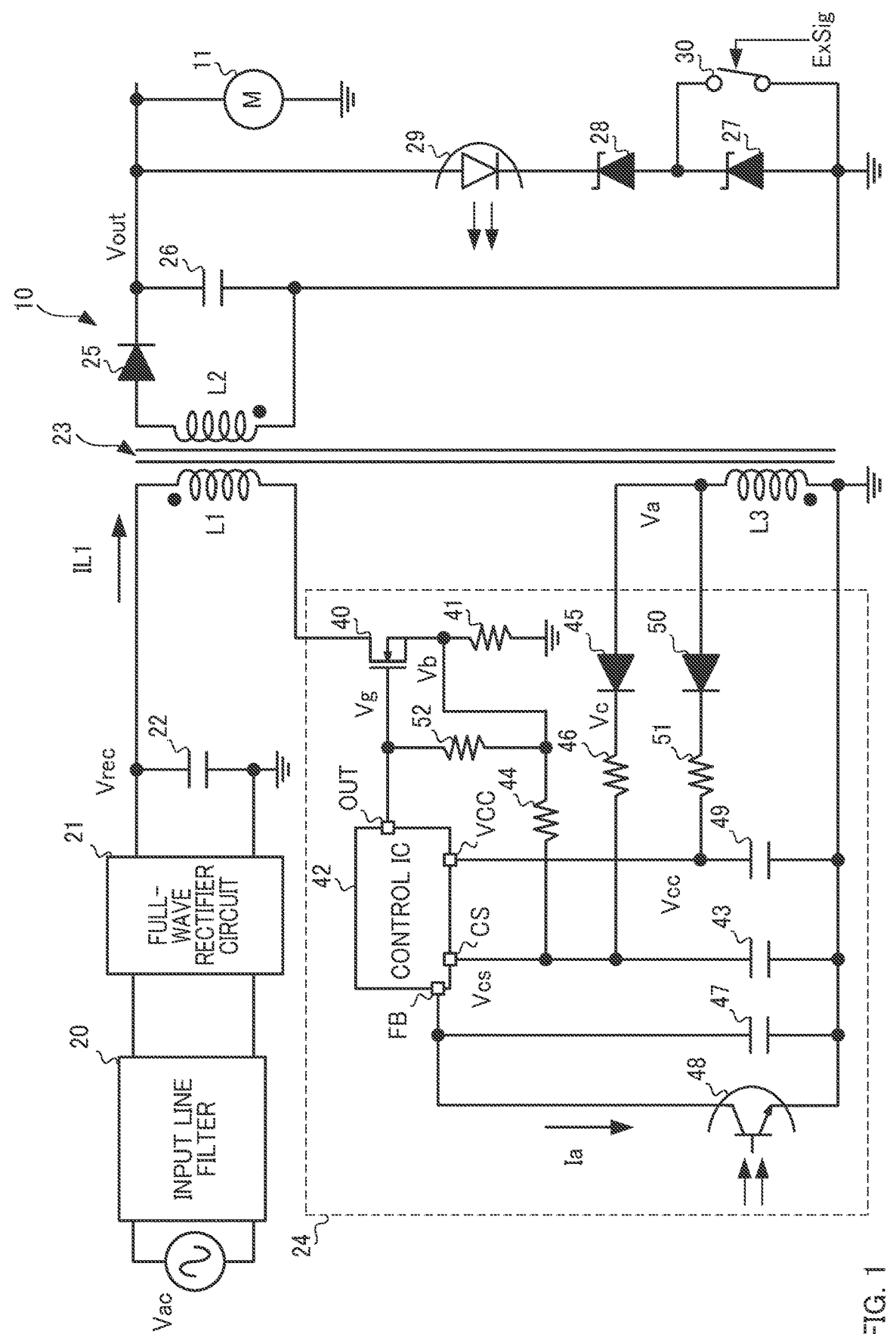
FIG. 1 is a diagram illustrating a configuration example of an AC-DC converter 10.

FIG. 1 is a diagram illustrating a configuration example of an AC-DC converter 10 which is an embodiment of the present disclosure. The AC-DC converter 10 is a flyback power supply circuit configured to generate an output voltage Vout from an alternating current (AC) voltage Vac of a commercial power supply, and perform control such that the output voltage Vout reaches a target level. Note that the AC voltage Vac corresponds to an "input voltage".

<<<Overview of AC-DC Converter 10>>>

The AC-DC converter 10 includes an input line filter 20, a full-wave rectifier circuit 21, capacitors 22, 26, a transformer 23, a control block 24, a diode 25, Zener diodes 27, 28, a light-emitting diode 29, and a switch 30. The AC-DC converter 10 supplies power to a motor 11 included in a printer, for example. The motor 11 is a load coupled to the AC-DC converter 10, and the output voltage Vout is applied thereto.

The input line filter 20 is provided between the full-wave rectifier circuit 21 (described later) and nodes to receive the predetermined AC voltage Vac that is to be inputted to the input line filter 20, and is a circuit to remove noise from the commercial power supply to the AC-DC converter 10. Note that the AC voltage Vac is, for example, a voltage of 100 to 240 V having a frequency of 50 to 60 Hz.

The full-wave rectifier circuit 21 full-wave rectifies the predetermined AC voltage Vac with noise thereof removed, to thereby output a resultant voltage, as a voltage Vrec, to the capacitor 22 and a primary coil L1 of the transformer 23. Further, the capacitor 22 smooths the voltage Vrec.

The transformer 23 has the primary coil L1, a secondary coil L2 magnetically coupled to the primary coil L1, and an auxiliary coil L3. Here, the secondary coil L2 and the auxiliary coil L3 are formed by winding such that voltages generated at the secondary coil L2 and the auxiliary coil L3 have a polarity opposite to the voltage generated at the primary coil L1.

The control block 24 controls an inductor current IL1 flowing through the primary coil L1 on the primary side of the transformer 23, to thereby control the voltage generated at the secondary coil L2 on the secondary side of the transformer 23. As a result, the output voltage Vout of a target level is generated on the secondary side of the transformer 23.

The diode 25 rectifies the current from the secondary coil L2 of the transformer 23, to thereby supply a resultant current to the capacitors 26. The capacitors 26 is charged with the current from the diode 25, and thus the output voltage Vout is generated across the terminals of the capacitors 26.

The Zener diodes 27, 28, and the light-emitting diode 29 are provided in series between the cathode of the diode 25 and the ground. Further, the Zener diodes 27, 28 are coupled in series such that the voltage corresponding to the output voltage Vout is applied as a reverse voltage. Further, the light-emitting diode 29 is provided between the cathode of the diode 25 and the cathode of the Zener diode 28.

The Zener diodes 27, 28 are elements to output a constant voltage, in response to the reverse voltage being applied thereto.

The light-emitting diode 29 is an element to emit light having an intensity corresponding to the voltage between the output voltage Vout and the cathode of the Zener diode 28.

The switch 30 is coupled in parallel with the Zener diode 27, to be turned on/off in response to an external signal ExSig from a device (e.g., printer) (not illustrated) configured to control the motor 11. Note that the switch 30 is turned on in response to the external signal ExSig from the printer, when the motor 11 enters a standby state with the printer entering the standby state, for example. Further, upon turning on of the switch 30, no reverse voltage is applied to the Zener diode 27, and the Zener diode 27 does not output a constant voltage. Thus, a difference in voltage between the output voltage Vout and the voltage at the cathode of the Zener diode 28 increases. Upon an increase in the difference between these voltages, the light-emitting diode 29 emits light with a greater intensity.

Further, when the switch 30 is turned off, the voltage at the cathode of the Zener diode 28 results in a voltage (e.g., 32 V) obtained by adding the voltages respectively outputted by the Zener diodes 27, 28. The target level of the output voltage Vout in this case is referred to as a first level. Meanwhile, when the switch 30 is turned on, the voltage at the cathode of the Zener diode 28 results in the voltage (e.g., 12 V) outputted by the Zener diode 28. The target level of the output voltage Vout in this case is referred to as a second level.

<<<Overview of Control Block 24>>>

The control block 24 is a circuit block to control the AC-DC converter 10. The control block 24 includes a power transistor 40, resistors 41, 44, 46, 51, 52, a control IC 42, capacitors 43, 47, 49, diodes 45, 50, and a phototransistor 48.

The power transistor 40 is an N-channel metal-oxide-semiconductor (NMOS) transistor to control power supplied to the motor 11. It is assumed, in an embodiment of the present disclosure, that the power transistor 40 is a Metal Oxide Semiconductor (MOS) transistor, however, the present disclosure is not limited thereto. The power transistor 40 may be, for example, an Insulated Gate Bipolar Transistor (IGBT) or the like, as long as it is a transistor capable of controlling power. Further, the power transistor 40 corresponds to a "first transistor".

The resistor 41 is to detect the inductor current IL1 flowing through the primary coil L1 when the power transistor 40 is on, and has one end coupled to the source electrode of the power transistor 40 and the other end that is grounded.

The control IC 42 is an integrated circuit configured to control switching of the power transistor 40 such that the level of the output voltage Vout reaches the target level. Specifically, the control IC 42 drives the power transistor 40, based on the inductor current IL1 and the output voltage Vout.

The control IC 42 has the terminal CS, FB, OUT, VCC, and the details of the control IC 42 will be described later. Note that the gate electrode of the power transistor 40 is coupled to the terminal OUT. Further, the actual control IC 42 has other terminals, however, they are omitted, for convenience of explanation.

The capacitor 43 is provided between the terminal CS and the ground, to receive, through the resistor 44, the voltage at the resistor 41 that is generated, with the inductor current IL1 flowing though the power transistor 40 when the power transistor 40 is on. Note that the capacitor 43 and the resistor 44 configure a low-pass filter, to thereby stabilize a voltage Vcs at the terminal CS. Note that the terminal CS corresponds to a "first terminal", and the resistor 41 corresponds to a "first resistor".

The diode 45 has an anode coupled to the auxiliary coil L3, and a cathode coupled to the terminal CS through the resistor 46. Accordingly, the capacitor 43 (i.e., terminal CS) receives the voltage at the resistor 41 when the power transistor 40 is on, and receives the voltage corresponding to a coil voltage Va of the auxiliary coil L3 when the power transistor 40 is off.

The capacitor 47 is provided between the terminal FB and the ground, to thereby stabilize a voltage Vfb at the terminal FB. Further, the voltage Vfb is a feedback voltage corresponding to the output voltage Vout, and is applied to the terminal FB. Note that the control IC 42 turns on the power transistor 40 at a frequency corresponding to the voltage Vfb, which will be described later in detail. Normally, in response to the voltage Vcs exceeding the voltage Vfb while the power transistor 40 is on, the control IC 42 turns off the power transistor 40. Further, it is assumed here that the control IC 42 compares the voltage Vcs and the voltage Vfb, to turn off the power transistor 40, however, the control IC 42 may compare the voltage corresponding to the voltage Vcs and the voltage corresponding to the voltage Vfb, to turn off the power transistor 40.

The phototransistor 48 is provided between the terminal FB and the ground, and configures a photocoupler, with the light-emitting diode 29 on the secondary side of the transformer 23. Further, the phototransistor 48 passes a larger sink current Ia when the intensity of the light emitted by the light-emitting diode 29 increases. In other words, the phototransistor 48 passes the larger sink current Ia to the terminal FB, in response to the output voltage Vout becoming higher relative to the target level and the intensity of the light from the light-emitting diode 29 increasing.

The capacitor 49 is provided between the terminal VCC and the ground. Further, the diode 50 has an anode coupled to the auxiliary coil L3, and a cathode coupled to the terminal VCC through the resistor 51. The voltage Va generated at the auxiliary coil L3 is applied to the capacitor 49 through the diode 50 and the resistor 51, and the voltage at the capacitor 49 results in a power supply voltage Vcc of the control IC 42. Note that the terminal VCC receives the voltage corresponding to the coil voltage Va at the auxiliary coil L3 when the power transistor 40 is off, in other words, the voltage at the capacitor 49. Note that the terminal VCC corresponds to a "second terminal".

The resistor 52 is provided, between the terminal OUT coupled to the gate electrode of the power transistor 40 and the ground through the resistor 41. Further, the resistor 52 is a pull-down resistor to prevent the power transistor 40 from being erroneously turned on when the terminal OUT is in a floating state, with the resistor 41. Note that the terminal OUT corresponds to a "third terminal", the gate electrode of the power transistor 40 corresponds to a "control electrode", and the resistor 52 corresponds to a "second resistor".

Here, the voltage Vfb changes according to the output voltage Vout, and determines the current value of the inductor current IL1, which will be described later in detail. In other words, the output voltage Vout determines the current value of the inductor current IL1. A change in the current value of the inductor current IL1 causes the voltage Va to change. Further, a change in the voltage Va causes the voltage Vcs when the power transistor 40 is off and the power supply voltage Vcc to change.

Accordingly, upon a change in the target of the output voltage Vout from the first level (e.g., 32 V) to the second level (e.g., 12 V), the voltage Vcs when the power transistor 40 is off and the power supply voltage Vcc change as well. Thus, by detecting a change in the power supply voltage Vcc and the voltage Vcs when the power transistor 40 is off, it is possible to detect a change in the target level of the output voltage Vout.

<<<Configuration of Control IC 42>>>

Figure 2:
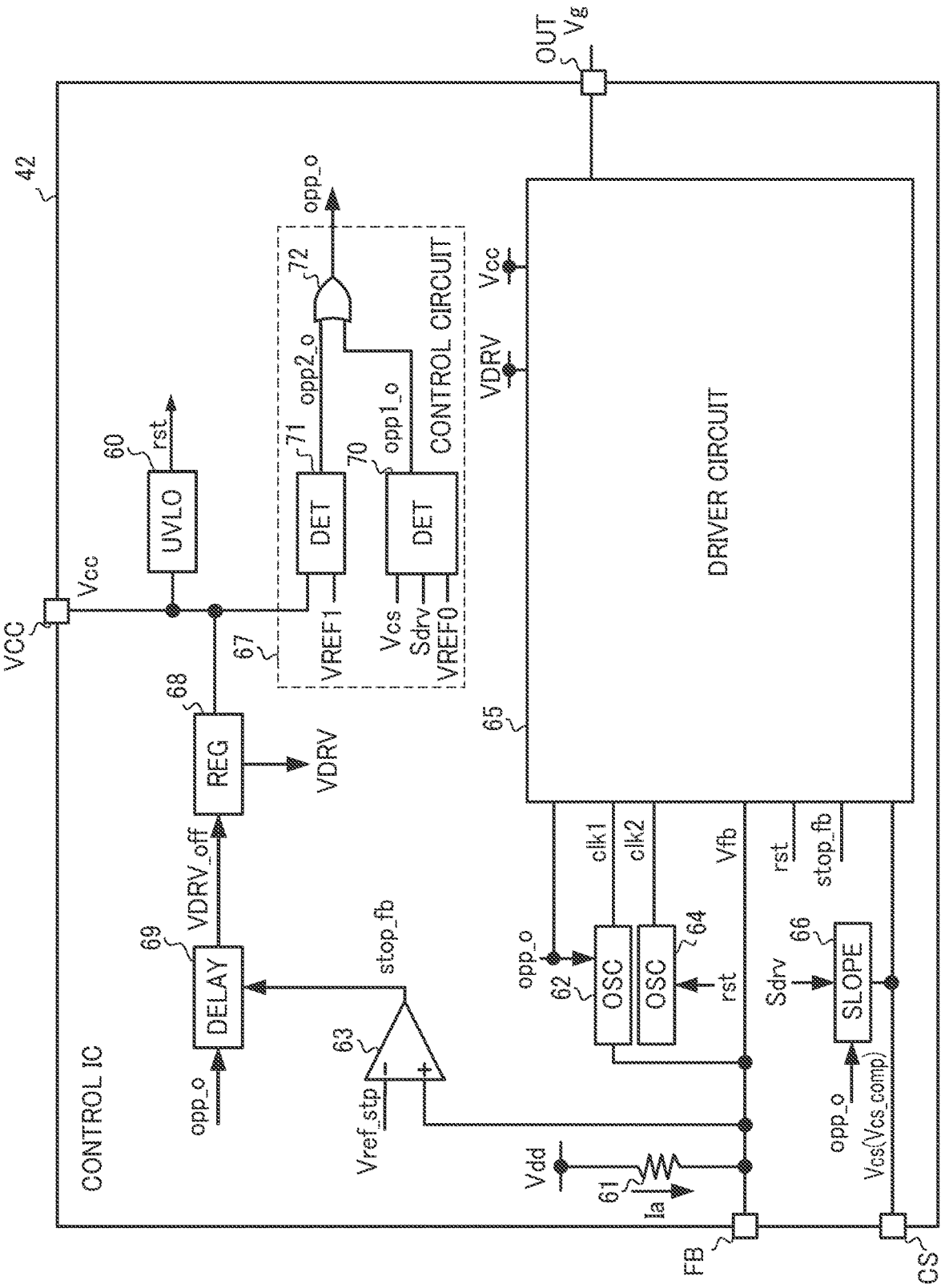
FIG. 2 is a diagram illustrating a configuration example of a control IC 42.

FIG. 2 is a diagram illustrating a configuration example of the control IC 42. The control IC 42 drives the power transistor 40 with a drive voltage Vg, based on the feedback voltage Vfb and the inductor current IL1, such that the AC-DC converter 10 outputs the output voltage Vout at the target level. The control IC 42 includes an under-voltage lockout circuit 60, a resistor 61, oscillator circuits (OSC) 62, 64, a comparator circuit 63, a driver circuit 65, a slope compensation circuit (SLOPE) 66, a control circuit 67, a regulator 68, and a delay circuit 69. Note that, in an embodiment of the present disclosure, in response to the target level of the output voltage Vout reaching the second level, the operations of the oscillator circuit 62, the slope compensation circuit 66, and a buffer circuit 81 (described later) in the driver circuit 65 is stopped as appropriate. Accordingly, the control IC 42 operates with a lower power consumption, when the target level is lowered.

Under-Voltage Lockout Circuit 60

The under-voltage lockout circuit (UVLO) 60 stops driving performed by the control IC 42, when the power supply voltage Vcc is equal to or lower than a first predetermined voltage (e.g., 6.5 V). Specifically, the under-voltage lockout circuit 60 outputs a reset signal rst at a low level (hereinafter, referred to as low or low level) to reset the control IC 42, in response to the power supply voltage Vcc becoming equal to or lower than the first predetermined voltage. Meanwhile, the under-voltage lockout circuit 60 outputs the signal rst at a high level (hereinafter, referred to as high or high level), in response to the power supply voltage Vcc exceeding a second predetermined voltage (e.g., 13 V). Note that the phrase "reset the control IC 42" indicates to stop the operation (here, driving) of the control IC 42 in response to the low signal rst, when the level of the power supply voltage Vcc is lower than the first predetermined voltage, so that the control IC 42 does not malfunction.

==Resistor 61==

The resistor 61 is provided between the terminal FB and a node to receive an internal voltage Vdd generated by a regulator (not illustrated) according to the power supply voltage Vcc, and generates the feedback voltage Vfb corresponding to the sink current Ia passed by the phototransistor 48. In other words, in response to the output voltage Vout becoming higher relative to the target level and the sink current Ia increasing, the feedback voltage Vfb drops. Further, in response to the target level of the output voltage Vout changing to the second level, the output voltage Vout becoming higher relative to the second level, and thus the intensity of the light from the light-emitting diode 29 increases, and the phototransistor 48 passes the greater sink current Ia. As a result, in response to the target level of the output voltage Vout changing to the second level, the feedback voltage Vfb drops.

==Oscillator Circuit 62==

The oscillator circuit (OSC) 62 outputs an oscillator signal clk1 having a frequency Fsw corresponding to the voltage Vfb. Specifically, the oscillator circuit 62 outputs the oscillator signal clk1 having a frequency in a range of Fsw0 to Fsw1 corresponding to the voltage Vfb, in response to the control circuit 67 (described later) outputting a low signal opp_o. Meanwhile, the oscillator circuit 62 stops operating, in response to the target level of the output voltage Vout reaching the second level, and the control circuit 67 outputting a high signal opp_o. Note that the control IC 42 turns on the power transistor 40 in response to the oscillator signal clk1, when the control circuit 67 outputs a low signal opp_o.

In an embodiment of the present disclosure, the phrase "stop operating" indicates to interrupt a current flowing through a target circuit.

Figure 3A:
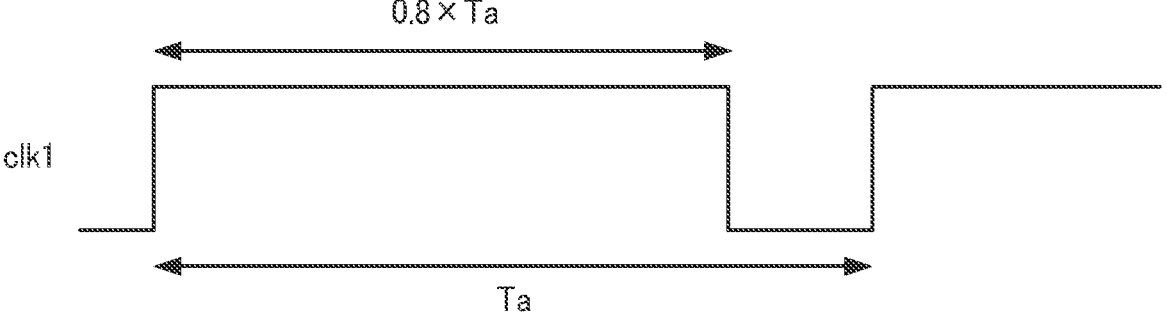
FIG. 3A is a chart illustrating an example of a clock signal clk1.

Further, the oscillator signal clk1 is an oscillator signal as illustrated in FIG. 3A. Specifically, the oscillator signal clk1 is an oscillator signal having a duty cycle greater than 50%, the duty cycle being determined by the time period for turning on the power transistor 40 relative to a period Ta, where the period Ta is the period of the oscillator signal clk1. Further, FIG. 3A illustrates the case in which the oscillator signal clk1 has 80% duty cycle.

==Comparator Circuit 63==

The comparator circuit 63 of FIG. 2 determines whether the driving of the power transistor 40 is stopped, based on the feedback voltage Vfb. Specifically, in response to the feedback voltage Vfb dropping below a reference voltage Vref_stp, the output voltage Vout is lowered, and thus the comparator circuit 63 outputs a low signal stop_fb to stop driving the power transistor 40. Meanwhile, when the feedback voltage Vfb is higher than the reference voltage Vref_stp, the comparator circuit 63 outputs a high signal stop_fb.

Figure 4:
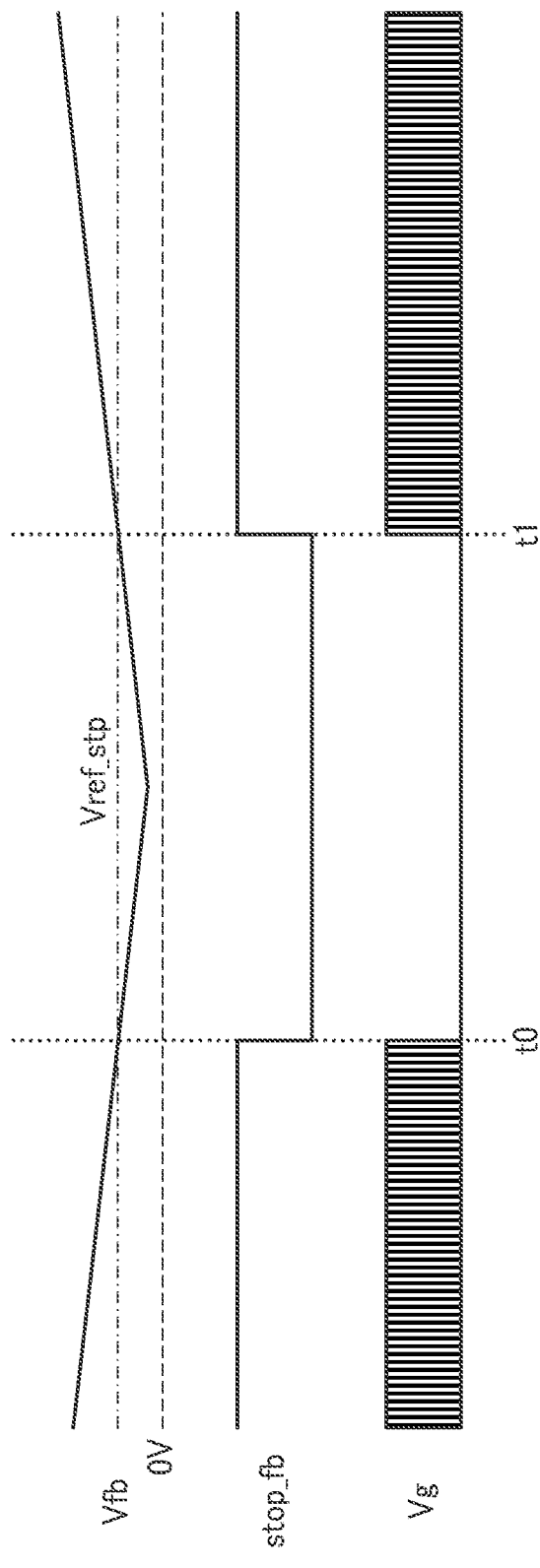
FIG. 4 is a chart illustrating an operation example when a feedback voltage Vfb drops and driving of a power transistor 40 is stopped.

FIG. 4 is a chart illustrating that the control IC 42 stops driving the power transistor 40 when the feedback voltage Vfb drops. At time to at which the output voltage Vout exceeds the target level and the feedback voltage Vfb drops below the reference voltage Vref_stp, the comparator circuit 63 outputs the low signal stop_fb. In response to the low signal stop_fb, the control IC 42 stops the driving of the power transistor 40 with the drive voltage Vg.

In response to the driving of the power transistor 40 being stopped and the output voltage Vout dropping, the feedback voltage Vfb rises, and exceeds the reference voltage Vref_stp at time t1. Then, the comparator circuit 63 outputs the high signal stop_fb. Then, in response to the high signal stop_fb, the control IC 42 resumes the driving of the power transistor 40 with the drive voltage Vg. Note that the comparator circuit 63 corresponds to a "determination circuit".

Figure 5A:
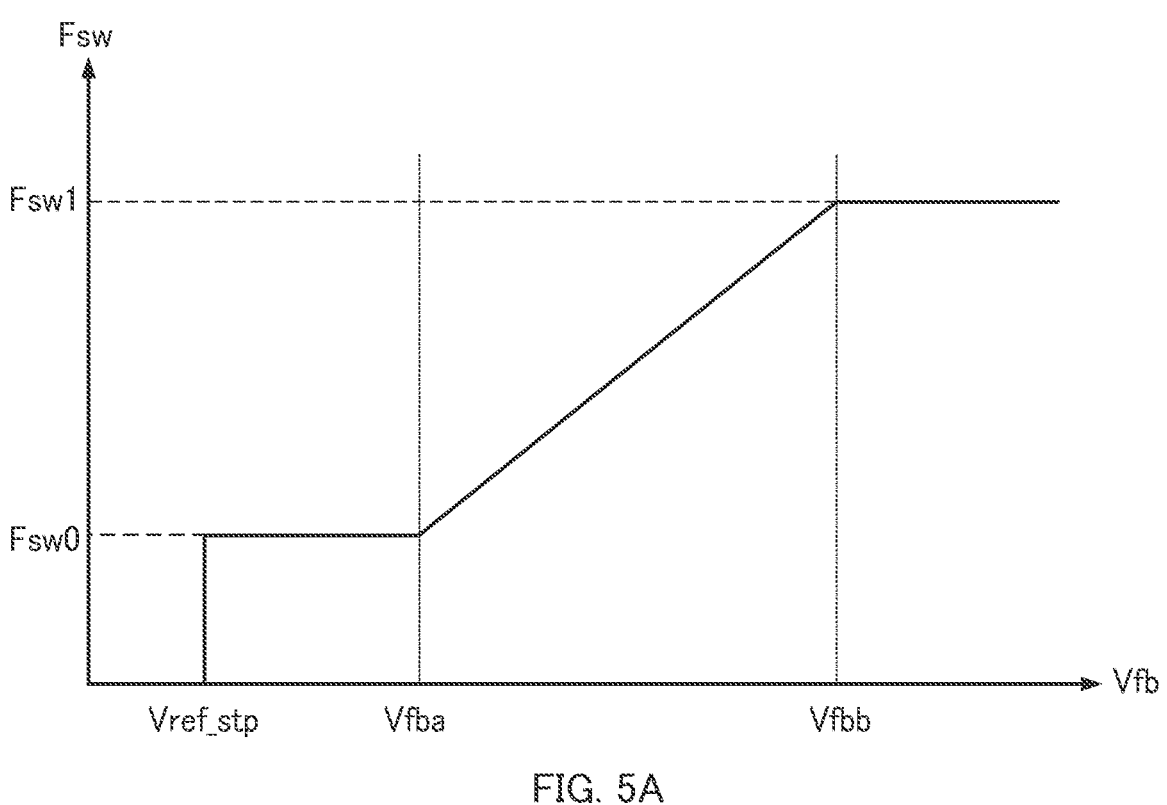
FIG. 5A is a chart illustrating an example of change in switching frequency.

Note that FIG. 5A illustrates how the oscillator circuit 62 changes the oscillator frequency Fsw of the oscillator signal clk1, in other words, the switching frequency of the power transistor 40, according to the feedback voltage Vfb. As illustrated in FIG. 5A, when the feedback voltage Vfb exceeds a voltage Vfbb, the oscillator circuit 62 outputs the oscillator signal clk1 having a frequency Fsw1 (e.g., 65 kHz).

Further, the oscillator circuit 62 outputs the oscillator signal clk1 in a range of a frequency Fsw0 to Fsw1 according to the feedback voltage Vfb, when the feedback voltage Vfb is in a range of voltages Vfba to Vfbb. Further, the oscillator circuit 62 outputs the oscillator signal clk1 having the frequency Fsw0 (e.g., 25 kHz), when the feedback voltage Vfb is in a range of the voltages Vref_stp to Vfba.

Further, when the feedback voltage Vfb drops below the reference voltage Vref_stp, the oscillator circuit 62 outputs the oscillator signal clk1 having the frequency Fsw0. However, when the feedback voltage Vfb drops below the reference voltage Vref_stp, the comparator circuit 63 outputs the low signal stop_fb to stop the driving of the power transistor 40, and thus the switching frequency of the power transistor 40 results in 0 Hz.

As such, the oscillator circuit 62 changes the oscillator frequency Fsw of the oscillator signal clk1, to thereby change the switching period of the power transistor 40. Further, in response to the output voltage Vout rising from the target level and the feedback voltage Vfb dropping, the oscillator frequency Fsw decreases. In response to the oscillator frequency Fsw decreasing and the switching period increasing, the AC-DC converter 10 performs a discontinuous operation. As a result, the output voltage Vout drops to approach the target level. Note that the oscillator circuit 62 corresponds to a "first oscillator circuit", and the oscillator signal clk1 corresponds to a "first oscillator signal", and the frequency of the oscillator signal clk1 corresponds to a "first frequency".

==Oscillator Circuit 64==

Figure 3B:
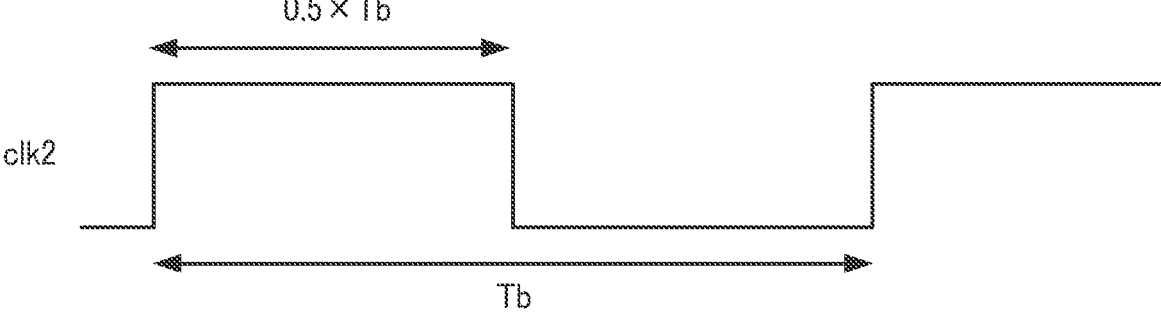
FIG. 3B is a chart illustrating an example of a clock signal clk2.

The oscillator circuit (OSC) 64 of FIG. 2 outputs an oscillator signal clk2 having a frequency Fsw2 (e.g., 32 kHz). Note that the oscillator signal clk2 is an oscillator signal as illustrated in FIG. 3B. Specifically, the oscillator signal clk2 is an oscillator signal having a duty cycle of 50% or less, the duty cycle being determined by the time period for turning on the power transistor 40 relative to a period Tb, where the period Ta is the period of the oscillator signal clk1.

Further, FIG. 3B illustrates the case in which the oscillator signal clk2 has 50% duty cycle. Note that the control IC 42 turns on the power transistor 40 in response to the oscillator signal clk2, when the control circuit 67 outputs a high signal opp_o, which will be described later.

Figure 5B:
FIG. 5B is a chart illustrating an example of change in switching frequency.

Further, FIG. 5B illustrates that when the output voltage Vout is close to the target level and the feedback voltage Vfb is higher than the reference voltage Vref_stp, the oscillator frequency of the oscillator signal clk2 is the frequency Fsw2. Note that the oscillator circuit 64 corresponds to a "second oscillator circuit", the oscillator signal clk2 corresponds to a "second oscillator signal", and the frequency Fsw2 corresponds to a "second frequency". Further, the oscillator circuit 62, 64 corresponds to an "oscillator circuit", and the oscillator signal clk1, clk2 corresponds to an "oscillator signal".

==Driver Circuit 65==

Figure 6:
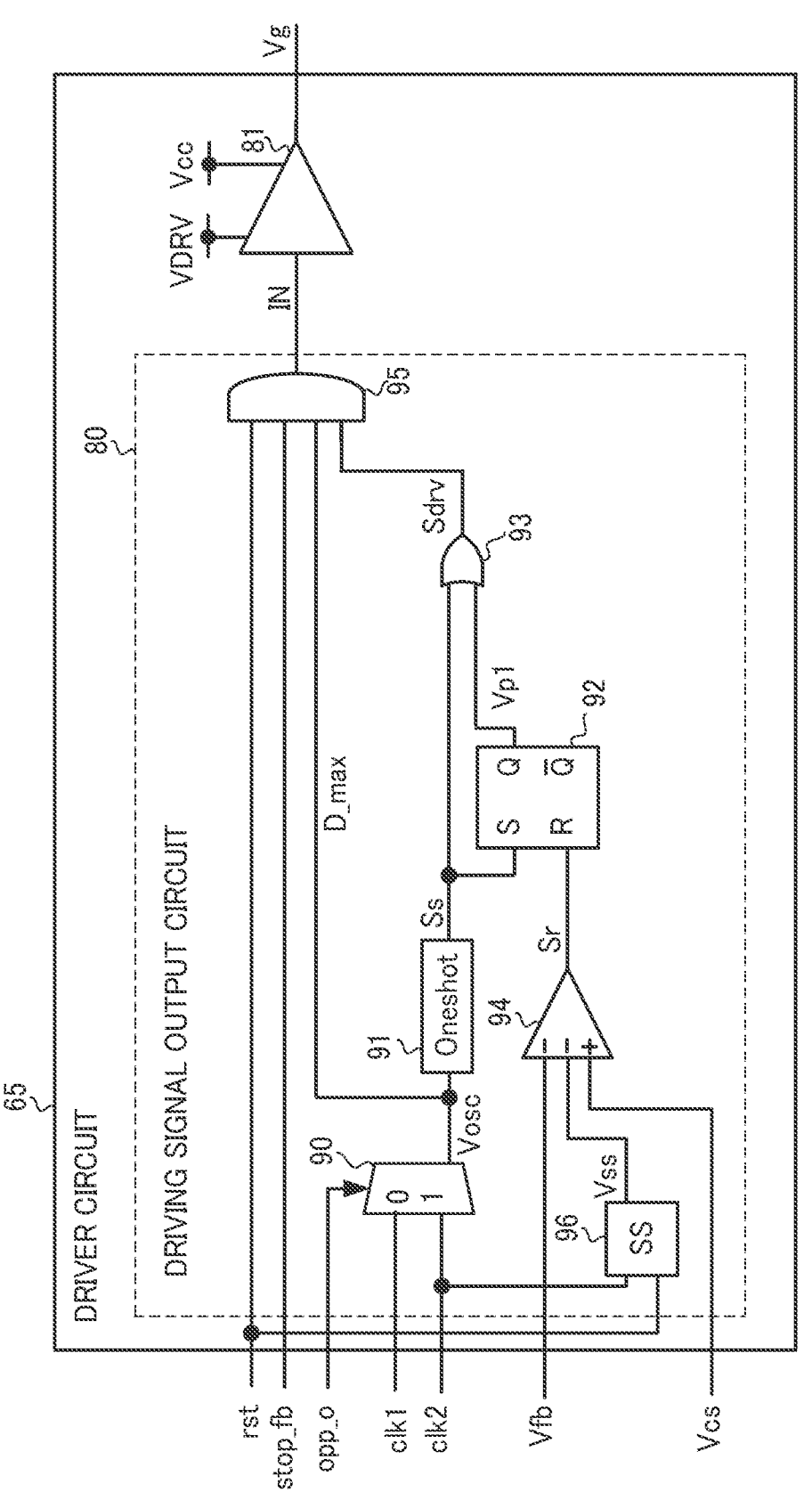
FIG. 6 is a diagram illustrating a configuration example of a driver circuit 65.

The driver circuit 65 of FIG. 2 outputs the drive voltage Vg to drive the power transistor 40, based on the oscillator signal clk1 or clk2, the feedback voltage Vfb, and the voltage Vcs. Specifically, the driver circuit 65 outputs the drive voltage Vg to turn on the power transistor 40, in response to the oscillator signal clk1, when the target level of the output voltage Vout is a first level. Further, the driver circuit 65 outputs the drive voltage Vg to turn on the power transistor 40 in response to the oscillator signal clk2, when the target level of the output voltage is the second level. Meanwhile, the driver circuit 65 outputs the drive voltage Vg to turn off the power transistor 40, in response to the voltage Vcs reaching the feedback voltage Vfb. The driver circuit 65 includes a driving signal output circuit 80 and the buffer circuit 81, as illustrated in FIG. 6.

===Driving Signal Output Circuit 80===

The driving signal output circuit 80 outputs a driving signal IN to drive the power transistor 40, in response to the oscillator signal clk1 or clk2, the feedback voltage Vfb, and the voltage Vcs. Specifically, the driving signal output circuit 80 outputs a high driving signal IN to turn on the power transistor 40, in response to the oscillator signal clk1 or clk2. Meanwhile, the driving signal output circuit 80 outputs a low driving signal IN to turn off the power transistor 40, in response to the voltage Vcs when the power transistor 40 is on reaching the feedback voltage Vfb.

Further, the driving signal output circuit 80 includes a selector 90, a one-shot circuit 91, an SR flip-flop 92, an OR circuit 93, a comparator circuit 94, an AND circuit 95, and a soft-start circuit 96.

====Selector 90====

The selector 90 outputs either the oscillator signal clk1 or clk2, as an oscillator signal Vosc, in response to the signal opp_o from the control circuit 67 (described later). Specifically, the selector 90 outputs the oscillator signal clk1 as the oscillator signal Vosc, upon receiving the low signal opp_o. Meanwhile, the selector 90 outputs the oscillator signal clk2 as the oscillator signal Vosc, upon receiving the high signal opp_o.

====One-Shot Circuit 91====

The one-shot circuit (Oneshot) 91 outputs a pulse signal Ss at the rising edge of the oscillator signal Vosc.

====SR Flip-Flop 92====

The SR flip-flop 92 outputs a high signal Vp1, in response to the one-shot circuit 91 outputting the pulse signal Ss. Meanwhile, the SR flip-flop 92 outputs a low signal Vp1, in response to the comparator circuit 94 outputting a high signal Sr, which will be described later.

====OR Circuit 93====

The OR circuit 93 takes the logical sum of the pulse signal Ss and the signal Vp1, to thereby output a resultant signal as a signal Sdrv. In other words, the OR circuit 93 outputs the high signal Sdrv, in response to the pulse signal Ss or the signal Vp1 going high. Meanwhile, the OR circuit 93 outputs the low signal Sdrv, in response to the pulse signal Ss and the signal Vp1 going low.

====Comparator Circuit 94====

The comparator circuit 94 compares the voltages Vcs and Vfb, to thereby output the high signal Sr to turn off the power transistor 40. Specifically, the comparator circuit 94 outputs the high signal Sr, in response to the voltage Vcs when the power transistor 40 is on exceeding the voltage Vfb. Meanwhile, the comparator circuit 94 outputs a low signal Sr, in response to the voltage Vcs when the power transistor 40 is on being lower than the voltage Vfb. Note that the capacitor 43 to generate the voltage Vcs is discharged by a discharge circuit (not illustrated) at a timing at which the power transistor 40 is turned on.

====AND Circuit 95====

The AND circuit 95 calculates the logical product of a signal D_max (i.e., oscillator signal Vosc) and the signals rst, stop_fb, Sdrv, to thereby output a resultant signal thereof as the driving signal IN. Specifically, the AND circuit 95 outputs the driving signal IN, based on the oscillator signal Vosc and the signal Sdrv, upon receiving the high signal rst, stop_fb.

Further, normally, the time period during which the signal D_max that is the high oscillator signal Vosc is received is longer than the time period during which the high signal Sdrv is received, and thus the AND circuit 95 outputs the driving signal IN in response to the signal Sdrv.

Meanwhile, for example, when the time period during which the high signal D_max is received becomes shorter than the time period during which the high signal Sdrv is received due to an occurrence of failure, the AND circuit 95 outputs the low driving signal IN in response to the low signal D_max. In other words, the signal D_max is a signal to determine the time period for turning on the power transistor 40 (e.g., the maximum time period during which the power transistor 40 is on). In this case, the failure refers to a failure of an element used to detect the feedback voltage Vfb or the voltage Vcs, for example, in the AC-DC converter 10.

Further, the AND circuit 95 outputs the low driving signal IN, upon receiving the low signal rst or stop_fb.

====Soft-Start Circuit 96====

The soft-start circuit (SS) 96 outputs a voltage Vss that changes in a stepwise manner, in response to the AC voltage Vac being applied to the AC-DC converter 10 and the power supply voltage Vcc rising. Specifically, in response to the under-voltage lockout circuit 60 outputting the signal rst to release the reset of the control IC 42, the soft-start circuit 96 outputs the voltage Vss that rises in a stepwise manner. Then, in response to a predetermined time period having elapsed since the release of the reset, the soft-start circuit 96 causes the voltage Vss to be a voltage (e.g., voltage Vdd) higher than at least the feedback voltage Vfb. Note that the soft-start circuit 96 includes a counter to measure the predetermined time period, so as to raise the voltage Vss in a stepwise manner. The oscillator signal clk2 is used as a clock signal to operate this counter.

Further, the comparator circuit 94 outputs the high signal Sr, in response to the voltage Vcs exceeding the lower of the feedback voltage Vfb or the voltage Vss. Accordingly, the voltage Vss that rises in a stepwise manner is lower than the feedback voltage Vfb, until the predetermined time period has elapsed since the release of the reset. The timing at which the power transistor 40 is turned off is determined by the voltage Vss that rises in a stepwise manner, and thus the time period during which the power transistor 40 is on increases in a stepwise manner. Accordingly, the output voltage Vout gradually rises at the startup of the AC-DC converter 10.

====Buffer Circuit 81====

The buffer circuit 81 outputs the drive voltage Vg to drive the power transistor 40, in response to the driving signal IN. Specifically, the buffer circuit 81 outputs the drive voltage Vg to turn on the power transistor 40, in response to the high driving signal IN, when the comparator circuit 63 of FIG. 2 determines that the driving of the power transistor 40 is not stopped. Meanwhile, the buffer circuit 81 outputs the drive voltage Vg to turn off the power transistor 40 in response to the low driving signal IN, when the comparator circuit 63 determining that the driving of the power transistor 40 is stopped. Further, the buffer circuit 81 stops driving the power transistor 40, in response to the comparator circuit 63 determining that the driving of the power transistor 40 is stopped. Note that the details of the operation of the buffer circuit 81 will be described later.

==Slope Compensation Circuit 66==

The slope compensation circuit (SLOPE) 66 of FIG. 2 generates a voltage Vcs_comp that compensates the voltage Vcs, in order to suppress so-called subharmonic oscillation. Specifically, the slope compensation circuit 66 outputs a current corresponding to the time period elapsed since the turning on of the power transistor 40, to the resistor 41 through the terminal CS.

Meanwhile, the slope compensation circuit 66 stops outputting the current, upon turning off of the power transistor 40. The slope compensation circuit 66 compensates the voltage Vcs that is generated with the inductor current IL1, advances the timing at which the power transistor 40 is turned off, and suppresses the generation of subharmonic oscillation. Hereinafter, the voltage Vcs_comp is also referred to as voltage Vcs. Note that the voltage Vcs corresponds to a "first voltage", and the voltage Vcs_comp corresponds to a "second voltage".

Further, in response to the control circuit 67 (described later) outputting the low signal opp_o, the power transistor 40 is driven in response to the oscillator signal clk1. In this case, the maximum ON period of the power transistor 40 can be 80% of the switching period, and thus the subharmonic oscillation may be generated.

Meanwhile, when the control circuit 67 outputs the high signal opp_o, the power transistor 40 is driven in response to the oscillator signal clk2. In this case, the oscillator signal clk2 is an oscillator signal having 50% duty cycle, and the maximum ON period of the power transistor 40 is 50% or less of the switching period, and thus the subharmonic oscillation is not generated. Accordingly, when the control circuit 67 outputs the high signal opp_o, the operation of the slope compensation circuit 66 is stopped.

==Control Circuit 67==

The control circuit 67 of FIG. 2 detects that the target level of the output voltage Vout drops from the first level to the second level, to thereby control the operation of various circuits (described later) in the control IC 42. Specifically, in the case where the voltage Vcs when the power transistor 40 is off is lower than a first predetermined level or the voltage Vcc is lower than a second predetermined level, the control circuit 67 outputs the high signal opp_o indicating that the target level has lowered. Note that the voltages Vcs, Vcc drop, in response to the target level of the output voltage Vout becoming the second level and the coil voltage Va from the auxiliary coil L3 of FIG. 1 dropping, which will be described later in detail.

Meanwhile, in the case where the voltage Vcs when the power transistor 40 is off is higher than the first predetermined level and the voltage Vcc is higher than the second predetermined level, the control circuit 67 outputs the low signal opp_o indicating that the target level has not lowered. The control circuit 67 includes detection circuits 70, 71 and an OR circuit 72.

===Detection Circuit 70===

The detection circuit (DET) 70 detects that the target level of the output voltage Vout has been changed, based on the voltage Vcs at the terminal CS. Specifically, the detection circuit 70 outputs, to the OR circuit 72, a high signal opp1_o, in response to the time period during which the voltage Vcs when the power transistor 40 is off (i.e., when the signal Sdrv is low) is lower than a reference voltage VREF0 having continued for a predetermined time period tp. Note that the reference voltage VREF0 is a reference voltage corresponding to the first predetermined level.

Meanwhile, the detection circuit 70 outputs, to the OR circuit 72, a low signal opp1_o, in response to the voltage Vcs when the power transistor 40 is off exceeding the reference voltage VREF0. Note that the capacitor 43 to generate the voltage Vcs is discharged by a discharge circuit (not illustrated) at the timing at which the power transistor 40 is turned on.

===Detection Circuit 71===

The detection circuit (DET) 71 detects that the target level of the output voltage Vout has been changed, based on the power supply voltage Vcc at the terminal VCC. Specifically, the detection circuit 71 outputs a high signal opp2_o to the OR circuit 72, in response to the power supply voltage Vcc dropping below a reference voltage VREF1. Note that the reference voltage VREF1 is a reference voltage corresponding to the second predetermined level.

Meanwhile, the detection circuit 71 outputs a low signal opp2_o, in response to the power supply voltage Vcc exceeding the reference voltage VREF1. Further, the OR circuit 72 calculates the logical sum of the opp1_o, opp2_o, to thereby output a resultant signal thereof as the signal opp_o.

As such, the detection circuit 70 detects that the target level has been changed, based on the voltage Vcs, and the detection circuit 71 detects that the target level has been changed, based on the voltage Vcc. Further, whether the detection circuit 70 or the detection circuit 71 detects the lowering of the target level, first, varies with the state of the circuit operation. Accordingly, with the detection circuits 70, 71 being provided, it becomes possible to appropriately detect the lowering of the target level.

Note that the phrase "after" the target level "has been changed into" the first level indicates after the control circuit 67 outputs the low signal opp_o, and the phrase "after" the target level "has been changed into" the second level indicates after the control circuit 67 outputs the high signal opp_o. Further, the operation of the control circuit 67 will be described later in detail.

Further, it is assumed that the operation mode of the control IC 42 when the signal opp_o is low is a "normal mode", and the operation mode of the control IC 42 when the signal opp_o is high is a "low-output mode". Note that the control circuit 67 corresponds to a "control circuit", the detection circuit 70 corresponds to a "first detection circuit", the detection circuit 71 corresponds to a "second detection circuit", and the OR circuit 72 corresponds to a "circuit". Further, the reference voltage VREF0 corresponds to the "first predetermined level", and the reference voltage VREF1 corresponds to the "second predetermined level".

==Regulator 68==

The regulator (REG) 68 generates a power supply voltage VDRV of a control circuit 200 (described later) of the buffer circuit 81, from the power supply voltage Vcc.

==Delay Circuit 69==

The delay circuit (DELAY) 69 stops the operation of the regulator 68, when the control IC 42 is in the "low-output mode" and stops driving the power transistor 40. Specifically, the delay circuit 69 outputs a high signal VDRV_off to cause the regulator 68 to stop outputting the power supply voltage VDRV in response to the high signal opp_o and the low signal stop_fb, after an elapse of a predetermined delay time D.

Meanwhile, the delay circuit 69 outputs a low signal VDRV_off, in response to the low signal opp_o or the high signal stop_fb. In other words, in response to the target level of the output voltage Vout becoming the second level and the comparator circuit 63 determining that the driving of the power transistor 40 is stopped, the control circuit 67 causes the regulator 68 to stop outputting the power supply voltage VDRV, to stop the operation of the buffer circuit 81. Specifically, the comparator circuit 63, the driver circuit 65, the control circuit 67, the regulator 68, and the delay circuit 69 operate as illustrated in FIG. 7.

<<Operations of Regulator 68 and Delay Circuit 69>>

Figure 7:
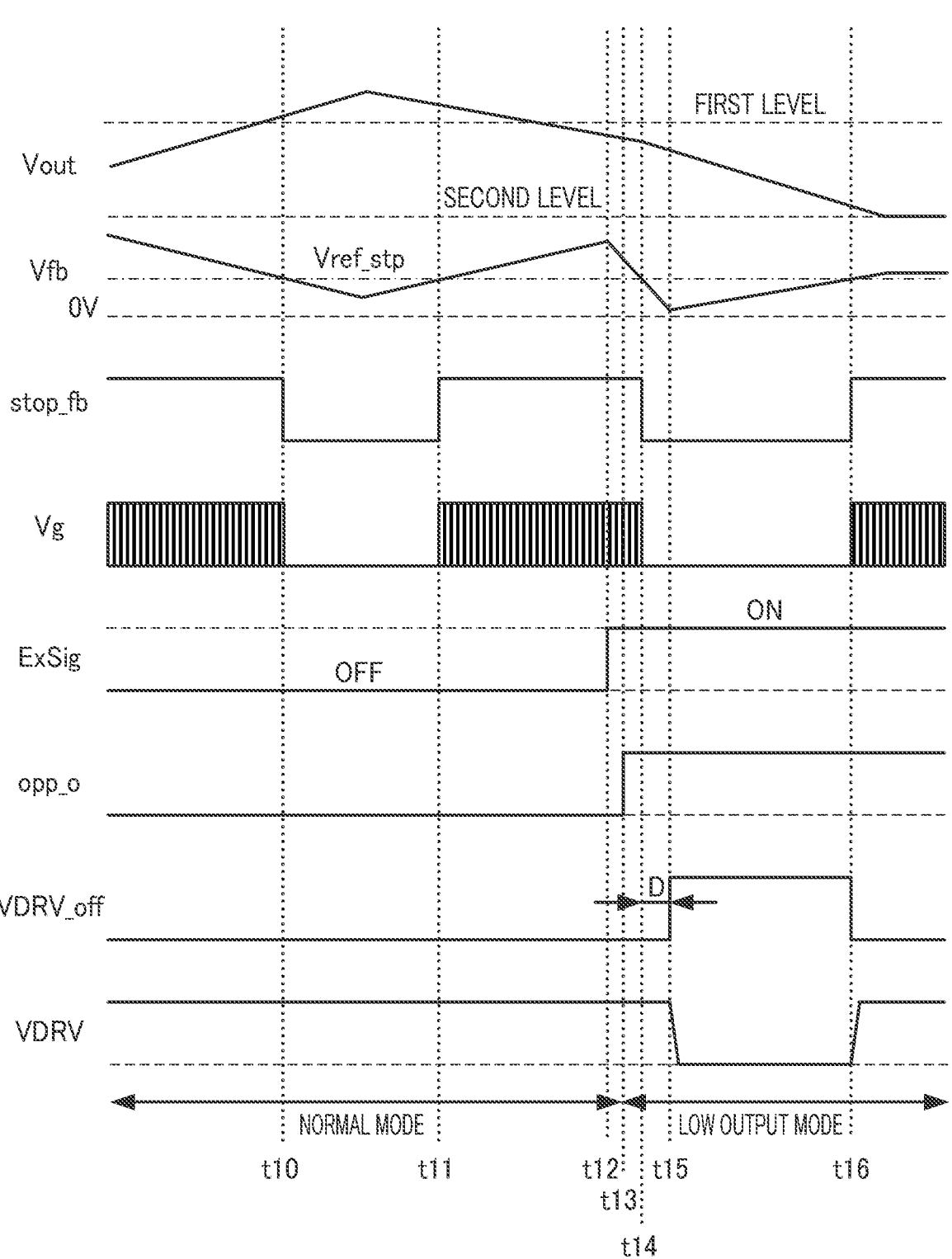
FIG. 7 is a chart illustrating an operation example of a regulator 68.

FIG. 7 is a chart illustrating an operation example of the regulator 68, based on the signal opp_o and the feedback voltage Vfb. It is assumed that, before time t10, a device to control the motor 11 outputs the low signal ExSig so that the switch 30 is off. Further, it is assumed that, before time t10, the output voltage Vout is rising, and the feedback voltage Vfb is dropping.

At time t10 at which the feedback voltage Vfb drops below the reference voltage Vref_stp, the comparator circuit 63 outputs the low signal stop_fb, and the driver circuit 65 stops driving the power transistor 40. In this case, the control circuit 67 is outputting a low signal opp_o, and thus the delay circuit 69 outputs the low signal VDRV_off. Thus, the regulator 68 continues to output the power supply voltage VDRV.

At time t11 at which the output voltage Vout drops with the driver circuit 65 stopping the driving of the power transistor 40 and the feedback voltage Vfb exceeding reference voltage Vref_stp, the comparator circuit 63 outputs the high signal stop_fb. The driver circuit 65 resumes driving the power transistor 40.

At time t12 at which a device (e.g., printer) to control the motor 11 outputs the signal ExSig to turn on the switch 30, the target level of the output voltage Vout becomes the second level. Accordingly, the output voltage Vout results in being higher relative to the second level, and thus the feedback voltage Vfb drops.

At time t13 at which the control circuit 67 detects the lowering of the target level, the control circuit 67 outputs the high signal opp_o. At this event, the control IC 42 transitions from the "normal mode" to the "low-output mode". Here, the time period during which the voltage Vcs in the time period during which the power transistor 40 is off is lower than the reference voltage VREF0 has continued for the predetermined time period tp, or the voltage Vcc has dropped below the reference voltage VREF1, and thus the control circuit 67 outputs the high signal opp_o.

At time t14 at which the feedback voltage Vfb drops below the reference voltage Vref_stp, the comparator circuit 63 outputs the low signal stop_fb. Then, the control IC 42 stops driving the power transistor 40.

At time t15 at which the predetermined delay time D has elapsed since time t14, the delay circuit 69 outputs the high signal VDRV_off. This causes the regulator 68 to stop outputting the power supply voltage VDRV.

At time t16, at which the output voltage Vout drops, with the driving of the power transistor 40 being stopped, and the feedback voltage Vfb exceeds the reference voltage Vref_stp, the comparator circuit 63 outputs the high signal stop_fb. This causes the delay circuit 69 to output the low signal VDRV_off, and the regulator 68 resumes outputting the power supply voltage VDRV. Then, the driver circuit 65 resumes driving the power transistor 40.

<<<Operation of Control IC 42 in "Normal Mode">>>

Figure 8:
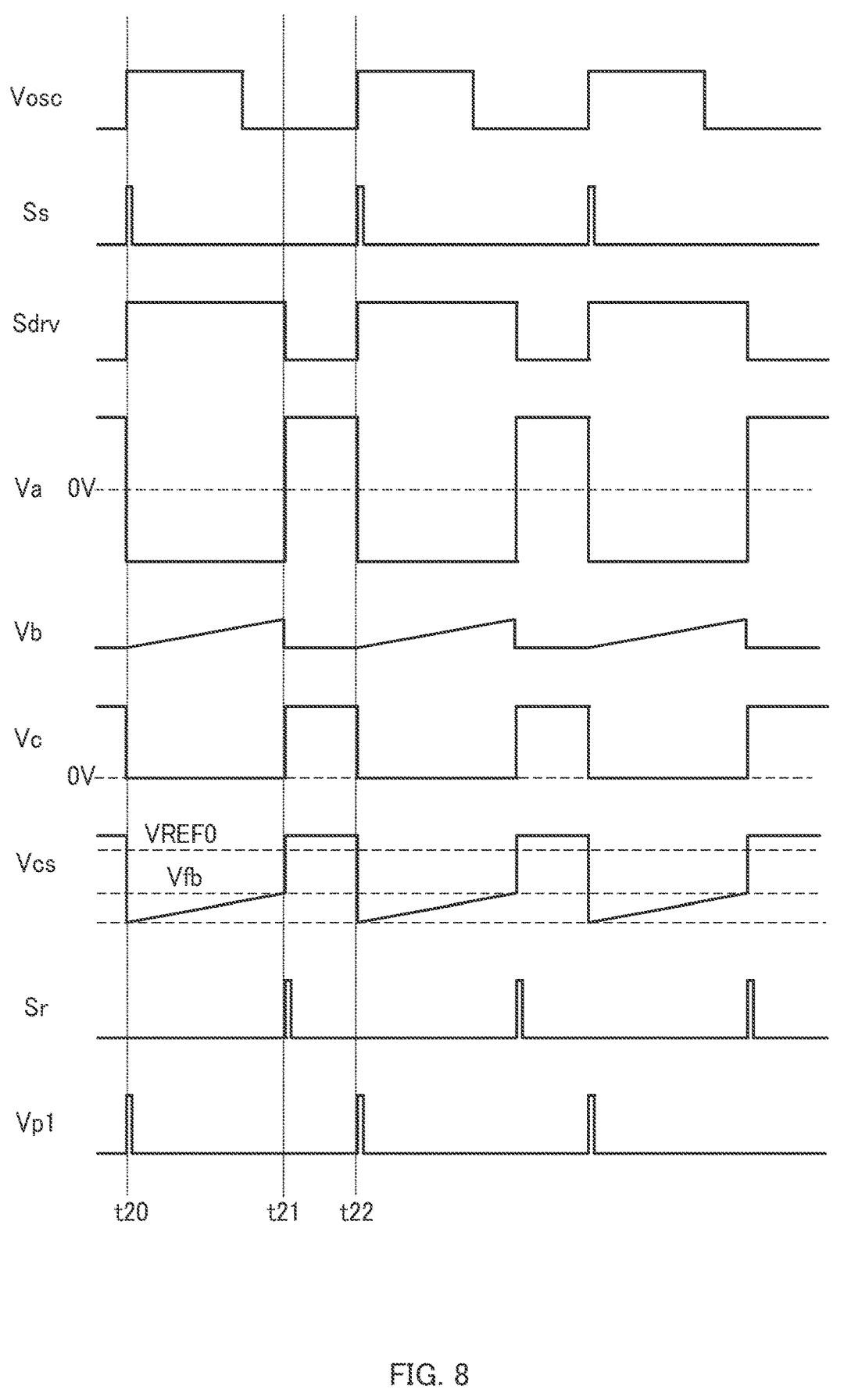

FIG. 8 is a chart illustrating an example of main waveforms of the AC-DC converter 10 and the control IC 42 when the control IC 42 operates in the "normal mode". It is assumed that the output voltage Vout is maintained at the first level since the control IC 42 is operating in the "normal mode". Further, it is also assumed that the feedback voltage Vfb is higher than the reference voltage Vref_stp and the one-shot circuit 91 of FIG. 6 outputs the pulse signal Ss. Further, it is also assumed that the voltage generated at the resistor 41 of FIG. 1 is a voltage Vb and the voltage at the cathode of the diode 45 is a voltage Vc. Further, the voltage Vc is applied to the capacitor 43 through the resistor 46. Further, the AC-DC converter 10 applies the output voltage Vout of the first level (e.g., 32 V) to the motor 11.

At time t20 at which the selector 90 of FIG. 6 outputs the high oscillator signal Vosc, in response to the oscillator signal clk1 having the frequency Fsw corresponding to the voltage Vfb, the one-shot circuit 91 outputs the pulse signal Ss. Then, the OR circuit 93 outputs the high signal Sdrv upon receiving the pulse signal Ss, and the SR flip-flop 92 outputs the high signal Vp1 upon receiving the pulse signal Ss.

Accordingly, the power transistor 40 is turned on, and the inductor current IL1 flows through the primary coil L1. Then, in response to the inductor current IL1 flowing through the power transistor 40, the voltage Vb corresponding to the inductor current IL1 is generated at the resistor 41. The voltage Vb generated at the resistor 41 according to an increase in the inductor current IL1 rises, and thus the voltage Vcs gradually rises.

Further, in response to the inductor current IL1 flowing through the primary coil L1, the coil voltage Va having a polarity opposite to the polarity of the voltage generated at the primary coil L1 is generated at the auxiliary coil L3.

In this event, the voltage Va is a negative voltage, and thus a current does not flow through the diode 45 and the resistor 46 to the capacitor 43, and the auxiliary coil L3 does not charge the capacitor 43.

At time t21 at which the voltage Vcs rises to the voltage Vfb, the comparator circuit 94 outputs the high signal Sr. Accordingly, the SR flip-flop 92 outputs the low signal Vp1, and the OR circuit 93 outputs the low signal Sdrv. Thus, the power transistor 40 is turned off. Further, upon turning off of the power transistor 40, the inductor current IL1 does not flow through the primary coil L1.

In response to the inductor current IL1 stopping flowing through the primary coil L1, the voltage generated at the primary coil L1 has a polarity opposite to the polarity when the power transistor 40 is turned on. Thus, the voltage Va generated at the auxiliary coil L3 results in a positive voltage. Since the inductor current IL1 does not flow, the voltage Vb reaches 0 V.

In this event, since the voltage Va is a positive voltage, and thus the voltage Vc obtained by transmitting the voltage Va through the diode 45 and the resistor 46 results in a positive voltage, and the voltage Vc is applied to the capacitor 43, and the capacitor 43 is charged with the voltage Va generated at the auxiliary coil L3. Further, since the voltage Vb is 0 V, the voltage Vcs results in the voltage Vc and exceeds the reference voltage VREF0.

Further, the voltage Va is utilized also as a voltage to generate the power supply voltage Vcc of the control IC 42, and thus is higher than the voltage Vcs generated with the voltage Vb. Further, with a change in the output voltage Vout, the inductor current IL1 changes, and the voltage Va changes in association therewith, and thus the voltage Vcs when the power transistor 40 is off also changes.

From time t22 at which the selector 90 outputs the high oscillator signal Vosc, the operation from time t20 to time t22 is repeated.

As such, in time t20 to t21, the capacitor 43 is charged with the voltage Vb generated at the resistor 41 according to the inductor current IL1. As a result, the voltage Vcs results in the voltage according to the inductor current IL1.

Meanwhile, in time t21 to t22, the inductor current IL1 does not flow, and thus the capacitor 43 is charged with the voltage Va generated at the auxiliary coil L3, without being charged with the voltage Vb. Further, since the target level of the output voltage Vout is the first level, the voltage Va is high. As a result, the voltage Vcs in time t21 to t22 is higher than the voltage Vcs in time t20 to t21 and the reference voltage VREF0.

<<<Operation of Control IC 42 when Mode Transitions>>>

===Transition from "Normal Mode" to "Low-Output Mode"===

Figure 9:
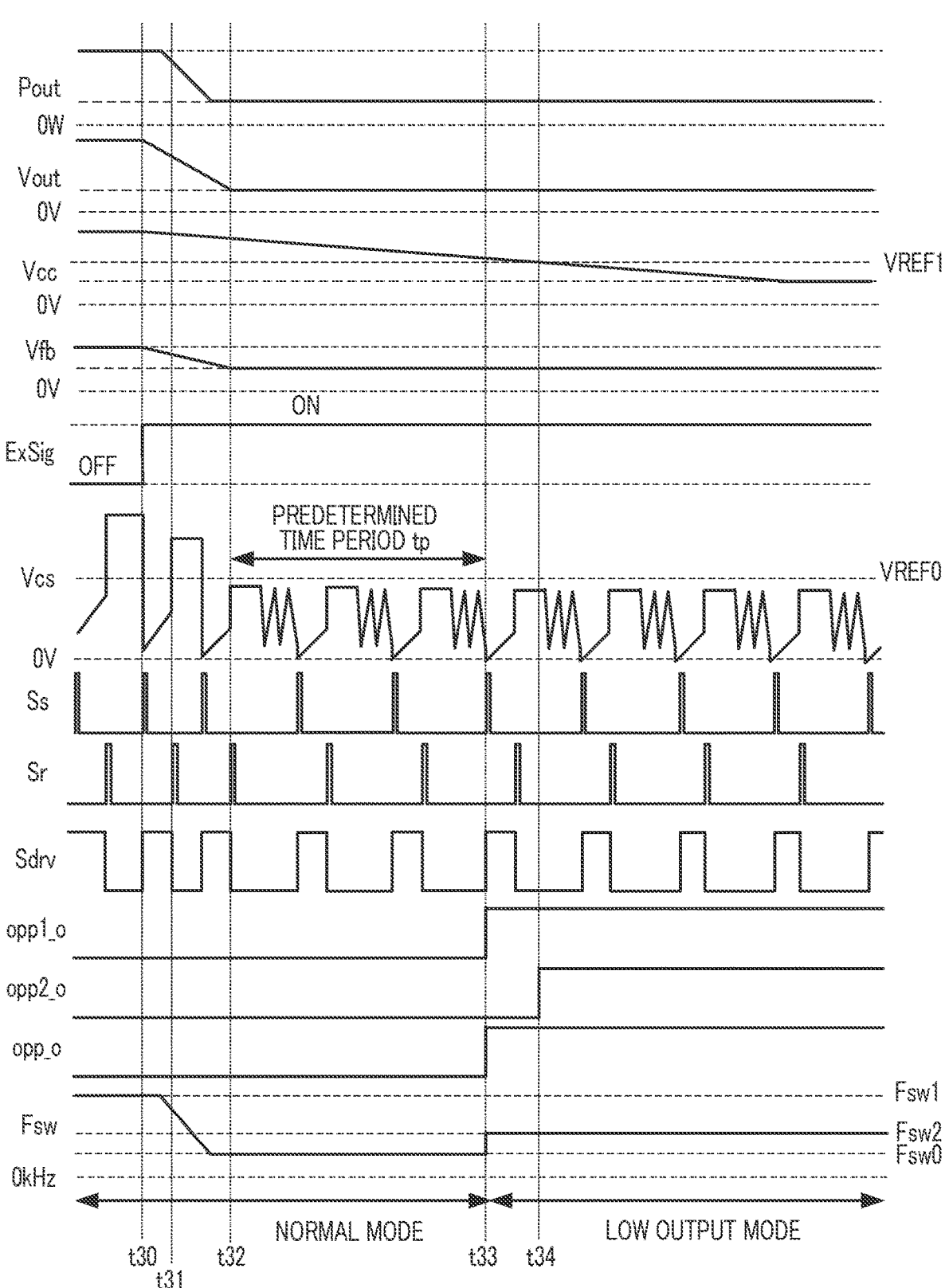
FIG. 9 is a chart illustrating an operation example of a control IC 42 when transitioning from a "normal mode" to a "low-output mode".

FIG. 9 is a chart illustrating an operation example of the control IC 42 when transitioning from the "normal mode" to the "low-output mode". It is assumed that the feedback voltage Vfb is never lower than the reference voltage Vref_stp. Further, the period of the signal Sdrv is different from the period thereof in actual operation, for convenience of explanation.

At time t30, the OR circuit 93 outputs the high signal Sdrv, in response to the one-shot circuit 91 outputting the pulse signal Ss. Accordingly, the power transistor 40 is turned on. Then, in the AC-DC converter 10, upon turning on of the switch 30 in response to the external signal ExSig, the output voltage Vout starts dropping so as to reach the second level (e.g., 12 V).

At time t31 at which the voltage Vcs when the power transistor 40 is on becomes equal to the voltage Vfb, the comparator circuit 94 outputs the high signal Sr. Then, the SR flip-flop 92 outputs the low signal Vp1, and the OR circuit 93 outputs the low signal Sdrv. Accordingly, the power transistor 40 is turned off.

Upon turning off of the power transistor 40, the voltage Vcs is charged from the auxiliary coil L3 through the diode 45 and the resistor 46. In this event, output power Pout starts to drop, the output voltage Vout also slightly drops from the first level (e.g., 32 V), and the inductor current IL1 when the power transistor 40 is on is large. Thus, the coil voltage Va at the auxiliary coil L3 is large, and the voltage Vcs when the power transistor 40 is off is higher than the reference voltage VREF0.

In this event, the intensity of the light emitted by the light-emitting diode 29 increases, since the voltage between the output voltage Vout and the voltage at the cathode of the Zener diode 28 increases with turning on of the switch 30. Accordingly, the phototransistor 48 passes the large sink current Ia, and the voltage Vfb results in dropping. Further, with the voltage Vfb dropping below the voltage Vfba, the one-shot circuit 91 starts to output the pulse signal Ss having the frequency Fsw0.

At time t32 at which the output voltage Vout reaches the second level (e.g., 12 V), and the voltage Vcs when the power transistor 40 is turned on is equal to the voltage Vfb having dropped, the power transistor 40 is turned off as at time t31. In this event, the voltage Vcs is charged with the coil voltage Va from the auxiliary coil L3. However, since the output power Pout has lowered and the output voltage Vout has also lowered already, the coil voltage Va at the auxiliary coil L3 decreases, and the voltage Vcs when the power transistor 40 is off is lower than the reference voltage VREF0.

At time t33 at which the time period during which the voltage Vcs when the power transistor 40 is off is lower than the reference voltage VREF0 has continued for the predetermined time period tp since time t32, the detection circuit 70 outputs the high signal opp1_o. Thus, the control circuit 67 outputs the high signal opp_o. This causes the oscillator circuit 62 and the slope compensation circuit 66 to stop operating. Further, the selector 90 selects the oscillator signal clk2 as the oscillator signal Vosc, to thereby output the oscillator signal Vosc having the frequency Fsw2. Note that the control IC 42 operates in the "normal mode" before time t33, and operates in the "low-output mode" from time t33. Further, as will be explained with reference to FIG. 14 as well, in the "low-output mode", with the operations of the oscillator circuit 62 and the slope compensation circuit 66 being stopped, the control IC 42 operates with low power consumption.

Thereafter, at time t34 at which the power supply voltage Vcc drops below the reference voltage VREF1, the detection circuit 71 outputs a high signal opp2_o. It is assumed, in FIG. 9, that with the detection circuit 70 outputting a high signal opp1_o, the mode transitions to the "low-output mode". However, there may be such a case, depending on conditions, in which, with the detection circuit 71 outputting the high signal opp2_o first, the mode transitions to the "low-output mode".

===Transition from "Low-Output Mode" to "Normal Mode"===

Figure 10:
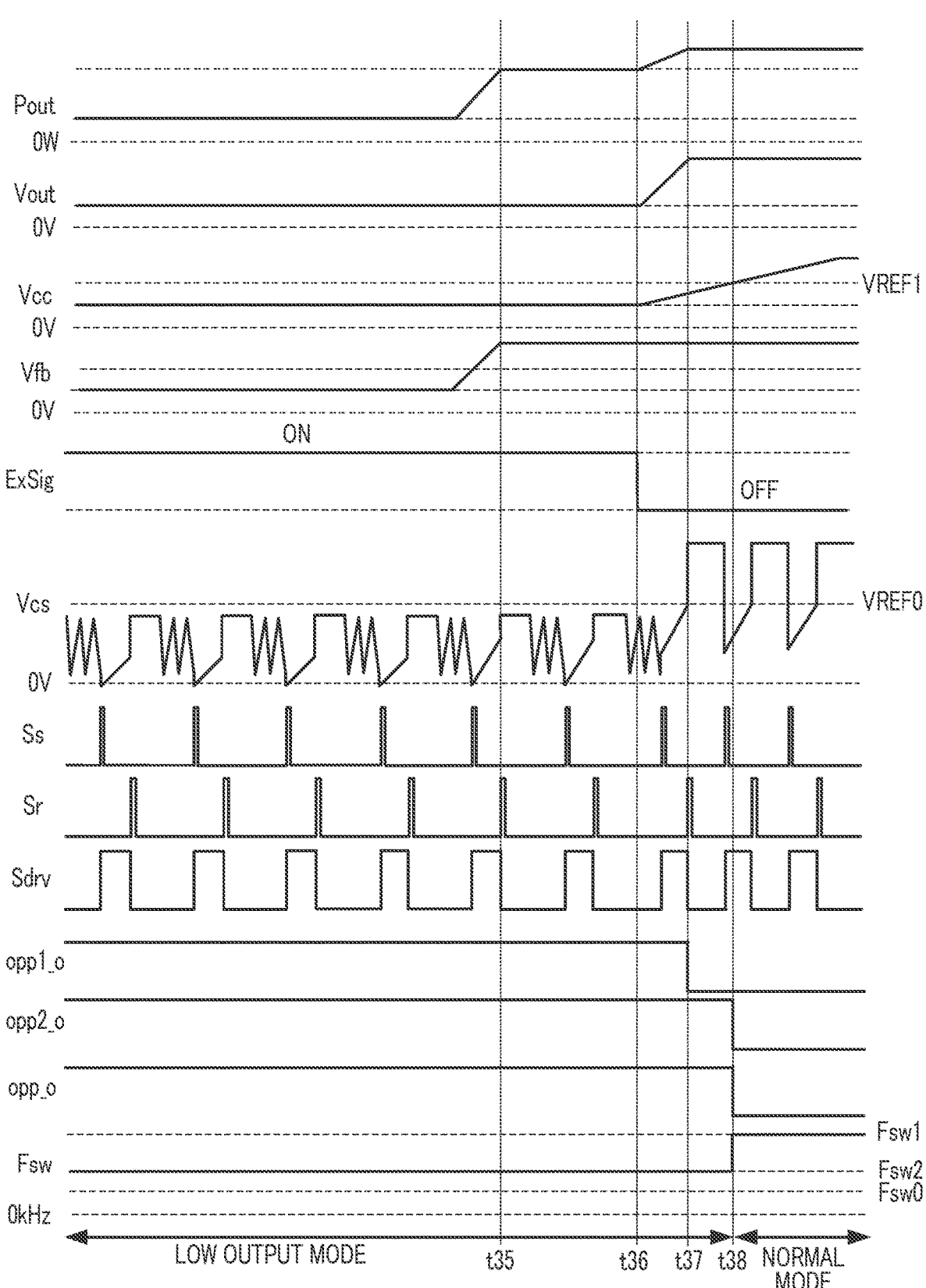
FIG. 10 is a chart illustrating an operation example of a control IC 42 when transitioning from a "low-output mode" to a "normal mode".

FIG. 10 is a chart illustrating an operation example of the control IC 42 when transitioning from the "low-output mode" to the "normal mode". It is assumed that, before time t35, the control IC 42 operates in the "low-output mode". Further, it is assumed that the feedback voltage Vfb is never lower than the reference voltage Vref_stp. Further, as in FIG.

9, the period of the signal Sdrv is different from the period thereof in actual operation, for convenience of explanation.

At time t35, due to a sudden change in the load of the motor 11, or the like, the current flowing through the light-emitting diode 29 decreases, and the intensity of the light emitted by the light-emitting diode 29 decreases. This causes the phototransistor 48 to pass the small sink current Ia, which results in a rise in the voltage Vfb.

In the AC-DC converter 10, at time t36 at which the switch 30 is turned off in response to the external signal ExSig, the target level of the output voltage Vout becomes the first level. Then, the output voltage Vout and the power supply voltage Vcc start to rise.

In response to the voltage Vcs when the power transistor 40 is off exceeding the reference voltage VREF0 at time t37, the detection circuit 70 outputs the low signal opp1_o. However, the power supply voltage Vcc is still lower than the reference voltage VREF1, and thus the detection circuit 71 is outputting the high signal opp2_0. Accordingly, the control circuit 67 is outputting the high signal opp_o.

At time t38 at which the power supply voltage Vcc exceeds the reference voltage VREF1, the detection circuit 71 outputs a low signal opp2_o. Then, the control circuit 67 outputs the low signal opp_o. This causes the oscillator circuit 62 and the slope compensation circuit 66 to resume operating. Further, the selector 90 selects the oscillator signal clk1 received from the oscillator circuit 62 as the oscillator signal Vosc. Further, the selector 90 outputs the oscillator signal Vosc having the frequency Fsw1, assuming that the feedback voltage Vfb is higher than the voltage Vfbb.

<<<Details of Buffer Circuit 81>>>

Figure 11:
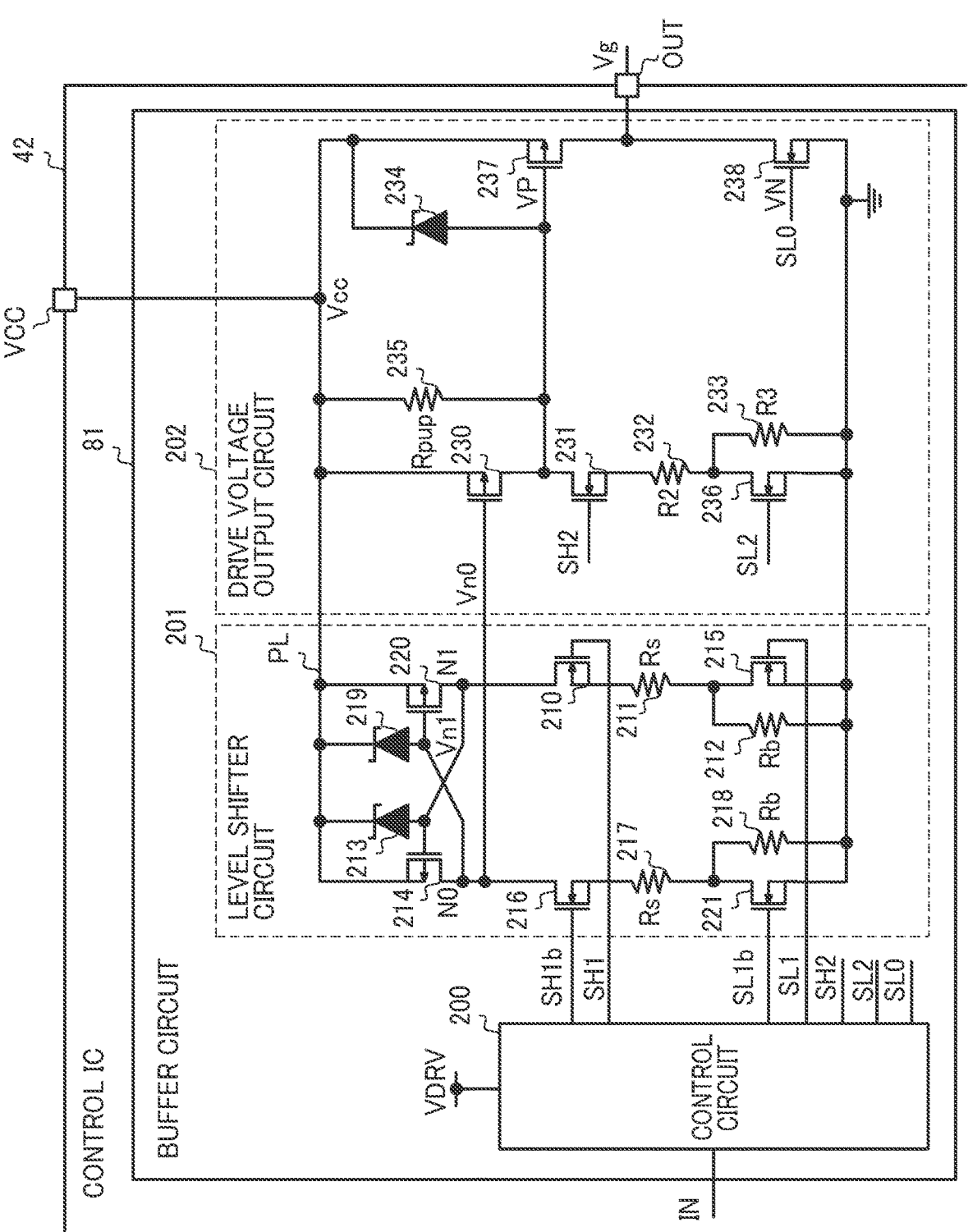
FIG. 11 is a diagram illustrating a configuration example of a buffer circuit 81.

FIG. 11 is a diagram illustrating a configuration example of the buffer circuit 81. As described above, the buffer circuit 81 of FIG. 6 outputs the drive voltage Vg to drive the power transistor 40, in response to the driving signal IN from the driving signal output circuit 80. The buffer circuit 81 includes the control circuit 200, a level shifter circuit 201, and a drive voltage output circuit 202.

==Control Circuit 200==

The control circuit 200 outputs various control signals to control the level shifter circuit 201 and the drive voltage output circuit 202 in response to the driving signal IN. In response to the driving signal IN, the control circuit 200 outputs main control signals, as illustrated in FIG. 12.

Specifically, in response to the driving signal output circuit 80 outputting the low driving signal IN, the control circuit 200 outputs control signals SH1, SH1b, SH2, SL0, as illustrated in a pattern P0 of FIG. 12. In this case, the buffer circuit 81 outputs the drive voltage Vg of a ground level from the terminal OUT.

Further, in response to the driving signal output circuit 80 outputting the high driving signal IN, the control circuit 200 outputs the control signals SH1, SH1b, SH2, SL0, as illustrated in a pattern P1. In this case, the buffer circuit 81 outputs the drive voltage Vg of the power supply voltage Vcc from the terminal OUT.

Note that the control circuit 200 operates based on the power supply voltage VDRV, and in response to the regulator 68 stopping the output of the power supply voltage VDRV, the control circuit 200 causes the voltage levels of the control signals SH1, SH1b, SH2, SL0, and other control signals to be the ground level, as illustrated in a pattern P2. In this case, the buffer circuit 81 causes the terminal OUT to be in a high-impedance (Hi-Z) state.

Level Shifter Circuit 201

The level shifter circuit 201 shifts the voltage level of the control signal SH1 received from the control circuit 200, and outputs a resultant voltage as a voltage Vn0 at a node NO. Specifically, in the case of the pattern P0 of FIG. 12, the level shifter circuit 201 outputs the voltage Vn0 that has dropped from the power supply voltage Vcc. It is assumed, in FIG. 12, that the voltage Vn0 in this case is low, for convenience.

Meanwhile, in the case of the pattern P1, the level shifter circuit 201 outputs the voltage Vn0 of the power supply voltage Vcc. It is assumed, in FIG. 12, that the voltage Vn0 in this case is high, for convenience.

The level shifter circuit 201 includes NMOS transistors 210, 215, 216, 221, resistors 211, 212, 217, 218, Zener diodes 213, 219, and PMOS transistors 214, 220. Note that after a description of the overview of the drive voltage output circuit 202, the configuration of the level shifter circuit 201 will be described according to the patterns P0 to P2 of FIG. 12 with the configuration of the drive voltage output circuit 202.

==Drive Voltage Output Circuit 202==

The drive voltage output circuit 202 outputs, to the terminal OUT, the drive voltage Vg to drive the power transistor 40, based on the voltage Vn0, the control signals SL0, SH2, and a control signal SL2. Specifically, in the case of the pattern P0, in response to the level shifter circuit 201 outputting the voltage Vn0 that has dropped from the power supply voltage Vcc by the voltage corresponding to a Zener voltage Vzd, the drive voltage output circuit 202 outputs the drive voltage Vg of the ground voltage, to thereby turn off the power transistor 40.

Meanwhile, in the case of the pattern P1, in response to the level shifter circuit 201 outputting the voltage Vn0 of the power supply voltage Vcc, the drive voltage output circuit 202 outputs the drive voltage Vg of the power supply voltage Vcc, to thereby turn on the power transistor 40. The drive voltage output circuit 202 includes PMOS transistors 230, 237, NMOS transistors 231, 236, 238, resistors 232, 233, 235, and a Zener diode 234. Note that the operations of the level shifter circuit 201 and the drive voltage output circuit 202 will be described below, however, for convenience of explanation, the operation in the case of the pattern P1 will be described first, and then the operation in the case of the pattern P0 will be described. Finally, the operation in the case of the pattern P2 will be described.

<<<Operations of Level Shifter Circuit 201 and Drive Voltage Output Circuit 202>>>

==Case of Pattern P1==

In the level shifter circuit 201, the NMOS transistor 210 is turned on/off in response to the control signal SH1. The control circuit 200 outputs the high control signal SH1 and the low control signal SH1b, in response to the high driving signal IN to turn on the power transistor 40. In response to the control circuit 200 outputting the high control signal SH1, to thereby turn on the NMOS transistor 210, a current flows through the resistors 211, 212 to the ground, to thereby turn on the Zener diode 213 having a cathode coupled to a power supply line PL that receives the power supply voltage Vcc.

Then, upon turning on of the Zener diode 213, the PMOS transistor 214 coupled to the power supply line PL is turned on. Further, the NMOS transistor 215 is coupled in parallel with the resistor 212. Upon turning on of the NMOS transistor 215, the current flowing through the NMOS transistor 210 increases, since the voltage according to the high control signal SH1 is originally applied to the resistors 211, 212. This makes it possible to quickly turn on the Zener diode 213.

Meanwhile, the NMOS transistor 216 is off. Accordingly, the voltage Vn0 at the node NO, which is a coupling point between the PMOS transistor 214 and the NMOS transistor 216 results in the power supply voltage Vcc, and the level shifter circuit 201 outputs the voltage Vn0 of the power supply voltage Vcc. Note that the Zener diode 213 is an element to protect the PMOS transistor 214.

In response to the level shifter circuit 201 outputting the voltage Vn0 of the power supply voltage Vcc, the PMOS transistor 230 coupled to the power supply line PL is turned off in the drive voltage output circuit 202. In this event, the control circuit 200 outputs the high signal SH2, to thereby turn on the NMOS transistor 231. Upon turning on of the NMOS transistor 231, a current flows through the resistors 232, 233 to the ground, to thereby turn on the Zener diode 234 having a cathode coupled to the power supply line PL. In this event, a current also flows through the resistor 235 coupled to the power supply line PL.

Further, in turning on the Zener diode 234, the control circuit 200 outputs the high control signal SL2, to thereby turn on the NMOS transistor 236 coupled in parallel with the resistor 233, and quickly turn on the Zener diode 234. Upon turning on of the Zener diode 234, the PMOS transistor 237 provided between the power supply line PL and the terminal OUT is turned on. In this event, the control circuit 200 outputs the low control signal SL0, to thereby turn off the NMOS transistor 238 provided between the terminal OUT and the ground. Accordingly, the drive voltage output circuit 202 outputs, to the terminal OUT, the drive voltage Vg of the power supply voltage Vcc to turn on the power transistor 40.

==Case of Pattern P0==

In the level shifter circuit 201, the NMOS transistor 216 is turned on/off in response to the control signal SH1b. The control circuit 200 outputs the low control signal SH1 and the high control signal SH1b, in response to the low driving signal IN to turn off the power transistor 40. In response to the control circuit 200 outputting the high signal SH1b, to thereby turn on the NMOS transistor 216, a current flows through the resistors 217, 218 to the ground, and the Zener diode 219 having a cathode coupled to the power supply line PL is turned on.

Then, upon turning on of the Zener diode 219, the PMOS transistor 220 coupled to the power supply line PL is turned on. Further, the NMOS transistor 221 is coupled in parallel with the resistor 218. Upon turning on of the NMOS transistor 221, the current flowing through the NMOS transistor 216 increases, since the voltage according to the high control signal SH1b is originally applied to the resistors 217, 218. This makes it possible to quickly turn on the Zener diode 219.

Further, upon turning on of the Zener diode 219, the PMOS transistor 220 coupled to the power supply line PL is turned on. Meanwhile, the NMOS transistor 210 is turned off, the PMOS transistor 214 is turned off, and the NMOS transistor 216 is turned on. Accordingly, the level shifter circuit 201 outputs the voltage Vn0 that has dropped from the power supply voltage Vcc by the voltage corresponding to the Zener voltage Vzd of the Zener diode 219. Note that the Zener diode 219 is an element to protect the PMOS transistor 220.

In response to the level shifter circuit 201 outputting the voltage Vn0 that has dropped from the power supply voltage Vcc by the voltage corresponding to the Zener voltage Vzd, the PMOS transistor 230 is turned on in the drive voltage output circuit 202. In this event, the control circuit 200 outputs the low signal SH2, to thereby turn off the NMOS transistor 231. Upon turning off of the NMOS transistor 231, a current does not flow through the resistors 232, 233, and the Zener diode 234 is turned off. In this event, a current does not flow through the resistor 235, either.

Upon turning off of the Zener diode 234, the PMOS transistor 237 is turned off. In this event, the control circuit 200 outputs the high control signal SL0, to thereby turn on the NMOS transistor 238. Accordingly, the drive voltage output circuit 202 outputs, to the terminal OUT, the drive voltage Vg of the ground voltage to turn off the power transistor 40.

==Case of Pattern P2==

Meanwhile, in the pattern P2, in response to the regulator 68 stopping the output of the power supply voltage VDRV, the voltage level of the control signal outputted by the control circuit 200 results in the ground level. Thus, in the level shifter circuit 201, the PMOS transistor 214 and the NMOS transistor 216 are turned off, and the voltage Vn0 at the node NO results in a high-impedance (Hi-Z) state.

However, in the drive voltage output circuit 202, the drain electrode of the PMOS transistor 230 configured to be turned on/off with the voltage Vn0 is pulled up to the power supply voltage Vcc by the resistor 235. Then, the Zener diode 234 is turned off and a voltage VP results in the power supply voltage Vcc, and thus the PMOS transistor 237 is turned off. Further, the control circuit 200 causes the voltage level of the control signal SL0 to be the ground level, and thus the NMOS transistor 238 is also turned off. Accordingly, the terminal OUT results in the high-impedance state, where neither the power supply voltage Vcc nor the ground voltage is applied thereto.

However, the terminal OUT is pulled down by the resistors 41, 52 of FIG. 1, and thus the voltage at the terminal OUT results in the ground voltage, and the power transistor 40 is turned off. Note that the voltage Vn0 corresponds to a "level-shift signal", and the NMOS transistor 216 corresponds to a "second transistor".

<<<Operation Example of Buffer Circuit 81>>>

Figure 13:
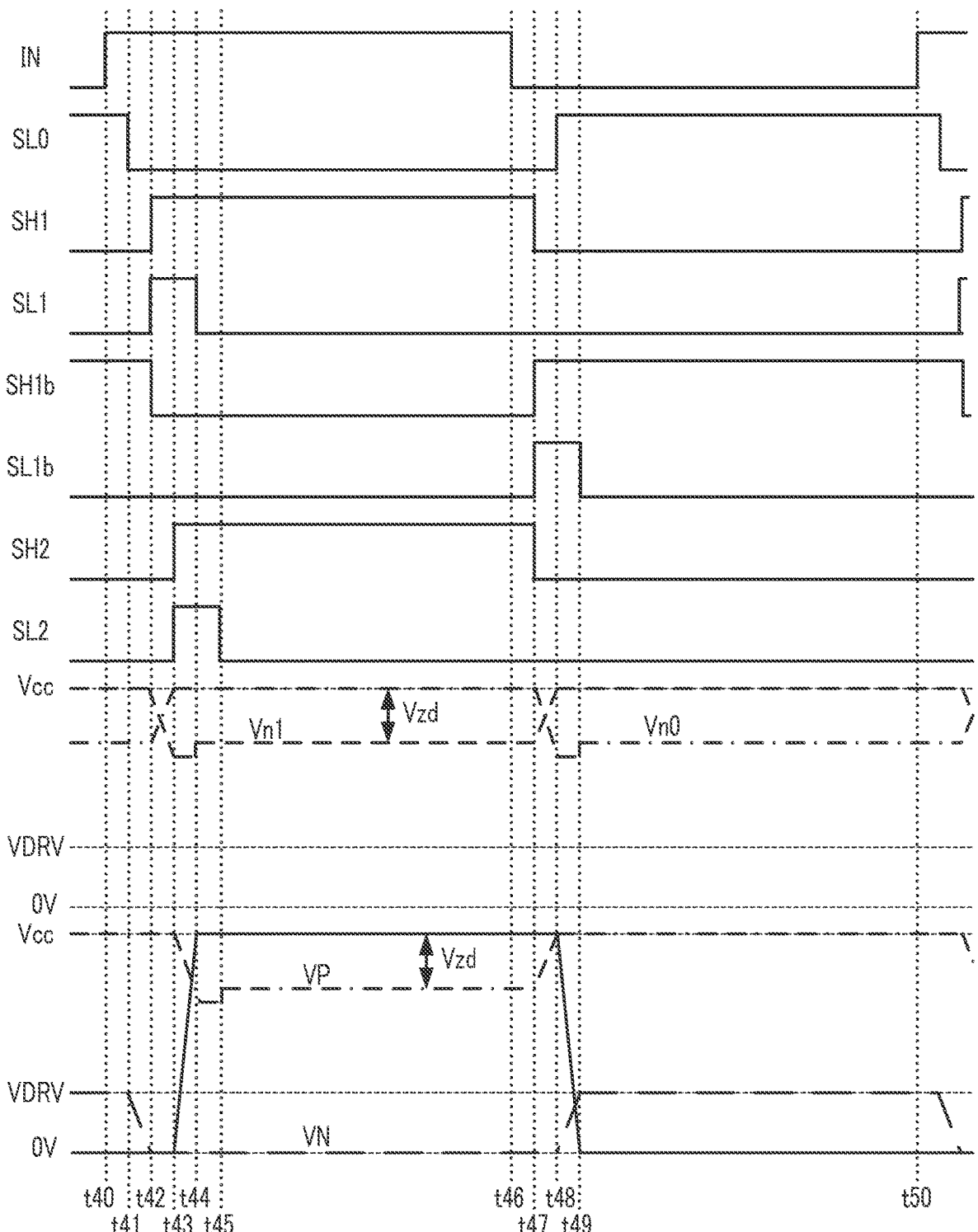
FIG. 13 is a chart illustrating an operation example of a buffer circuit 81.

FIG. 13 is a chart illustrating an operation example of the buffer circuit 81. Note that FIG. 13 illustrates how the control circuit 200 outputs various control signals, and how the level shifter circuit 201 and the drive voltage output circuit 202 operate according thereto.

At time t40, the driving signal output circuit 80 of FIG. 6 outputs the high driving signal IN. The control circuit 200 outputs the low control signal SL0 at time t41 in response to the high driving signal IN, and a voltage VN reaches the ground voltage, and thus the NMOS transistor 238 is turned off.

At time t42 at which the control circuit 200 outputs the high control signal SH1, a high control signal SL1, and the low control signal SH1b, the NMOS transistor 210 is turned on in response to the high control signal SH1. In response to the NMOS transistor 210 being turned on and the Zener diode 213 being turned on, the PMOS transistor 214 is turned on and the NMOS transistor 216 is turned off. Accordingly, the level shifter circuit 201 outputs the voltage Vn0 of the power supply voltage Vcc, as depicted by a dashed-dotted line.

At time t43 at which the control circuit 200 outputs the high control signals SH2, SL2, the level shifter circuit 201 outputs the voltage Vn0 of the power supply voltage Vcc, and thus the PMOS transistor 230 is turned off. Then, with the NMOS transistors 231, 236 being turned on, the Zener diode 234 is turned on, and a current flows through the resistors 235, 232. This causes the gate voltage VP of the PMOS transistor 237 to be the voltage that has substantially dropped from the power supply voltage Vcc by the voltage corresponding to the Zener voltage Vzd, and the PMOS transistor 237 is turned on. Accordingly, the drive voltage output circuit 202 outputs the drive voltage Vg of the power supply voltage Vcc.

At time t44 at which the control circuit 200 outputs a low control signal SL1, the current flowing through the NMOS transistor 210 decreases, and a voltage Vn1 at a node N1, which is a coupling point between the PMOS transistor 220 and the NMOS transistor 210, results in the voltage that has dropped from the power supply voltage Vcc by the voltage corresponding to the Zener voltage Vzd, as depicted by a dashed line.

At time t45 at which the control circuit 200 outputs the low control signal SL2, the current flowing through the NMOS transistor 231 decreases, and the voltage VP results in the voltage having dropped from the power supply voltage Vcc by the voltage corresponding to the Zener voltage Vzd.

At time t46, the driving signal output circuit 80 outputs the low driving signal IN. In response to the low driving signal IN, the control circuit 200 outputs the low control signals SH1, SH2, the high control signal SH1*b*, and a high control signal SL1*b* at time t47. Thus, the NMOS transistor 210 is turned off and the NMOS transistor 216 is turned on.

In response to the NMOS transistor 216 being turned on and the Zener diode 219 being turned on, the PMOS transistor 220 is turned on and the PMOS transistor 214 is turned off. Accordingly, the level shifter circuit 201 outputs the voltage Vn0 that has substantially dropped from the power supply voltage Vcc by the voltage corresponding to the Zener voltage Vzd. The PMOS transistor 230 is turned on based on the voltage Vn0, and the NMOS transistor 231 is turned off based on the low control signal SH2. As a result, the voltage VP reaches the power supply voltage Vcc and the PMOS transistor 237 is turned off.

At time t48 at which the control circuit 200 outputs the high control signal SL0, the voltage VN reaches the power supply voltage VDRV, the NMOS transistor 238 is turned on, and the drive voltage output circuit 202 outputs the drive voltage Vg of the ground voltage.

At time t49 at which the control circuit 200 outputs a low control signal SL1*b*, the NMOS transistor 221 is turned off. Upon turning off of the NMOS transistor 221, the level shifter circuit 201 outputs the voltage Vn0 that has dropped from the power supply voltage Vcc by the voltage corresponding to the Zener voltage Vzd.

Thereafter, at time t50, the driving signal output circuit 80 outputs the high driving signal IN. From time t50, the operation from time t40 to time t50 is repeated.

<<<Summary of Operation of Control IC 42>>>

Figure 14:
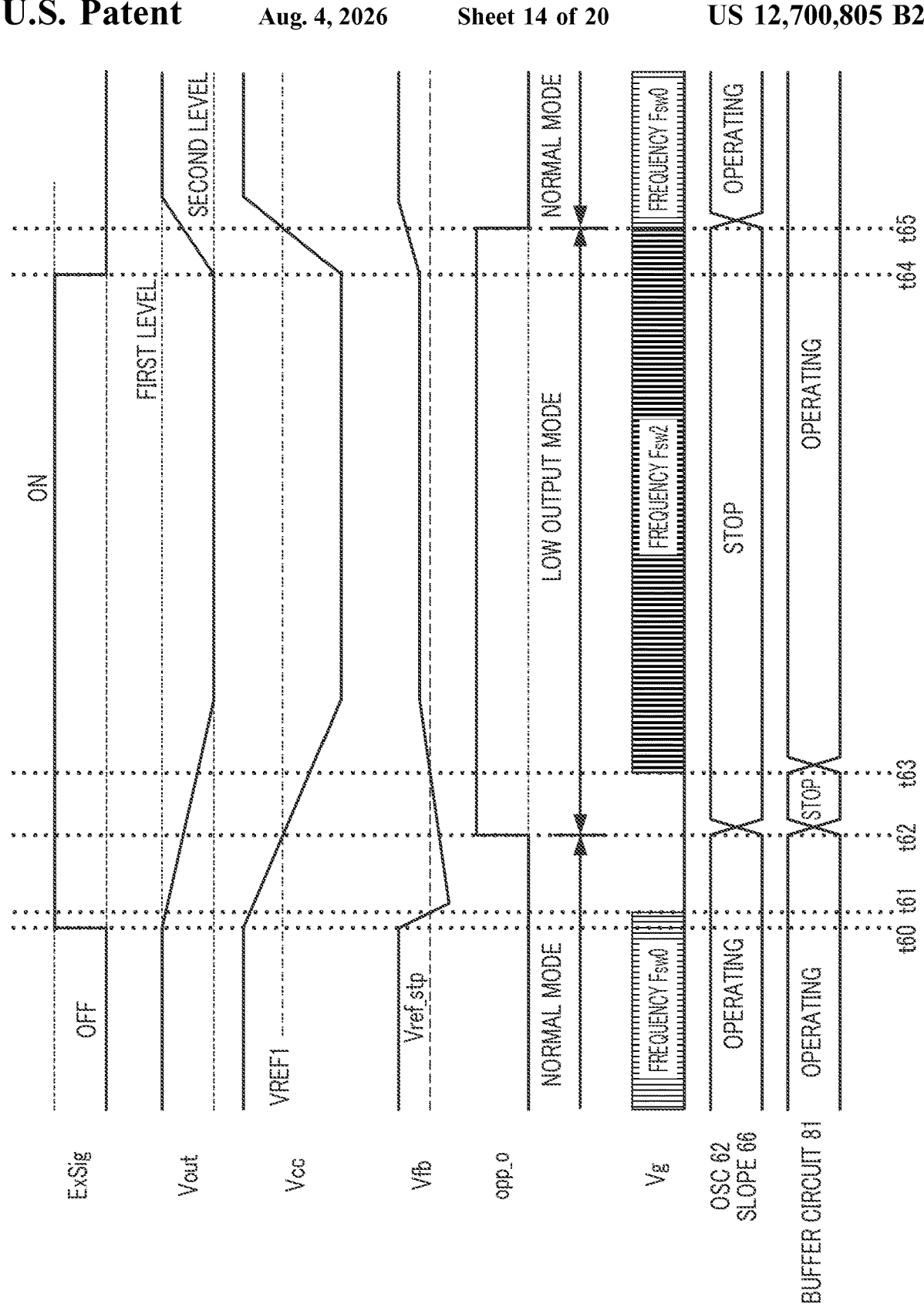
FIG. 14 is a chart illustrating an operation example of a control IC 42.

FIG. 14 is a chart illustrating an operation example of the control IC 42. FIG. 14 summarizes the operations of the control IC 42 that have been described above. It is assumed that, before time t60, the control IC 42 operates in the "normal mode". Further, a description will be given assuming that the transition of the control IC 42 from the "normal mode" to the "low-output mode" is performed based on the result of detection of the detection circuit 71. However, even if the transition of the control IC 42 is performed based on the result of detection of the detection circuit 70, the operation of the control IC 42 is substantially the same.

At time t60 at which the switch 30 is turned on, the target level of the output voltage Vout becomes the second level. The output voltage Vout results in being higher relative to the second level. Accordingly, in association with a drop in the feedback voltage Vfb, the output voltage Vout also starts to drop. Similarly, the power supply voltage Vcc also starts to drop.

At time t61 at which the feedback voltage Vfb drops below the reference voltage Vref_stp, the comparator circuit 63 outputs the low signal stop_fb, and thus the driving signal output circuit 80 outputs the low driving signal IN. Accordingly, the buffer circuit 81 outputs the drive voltage Vg of the ground level, to thereby stop driving the power transistor 40.

At time t62 at which the power supply voltage Vcc drops below the reference voltage VREF1, the control circuit 67 outputs the high signal opp_o. In response to the control circuit 67 outputting the high signal opp_o, the oscillator circuit (OSC) 62 and the slope compensation circuit (SLOPE) 66 stop operating.

Further, the feedback voltage Vfb is still lower than the reference voltage Vref_stp, and the comparator circuit 63 is outputting the low signal stop_fb, as well as the control circuit 67 outputs the high signal opp_o, and thus the buffer circuit 81 also stops operating. Further, in this event, the regulator 68 stops outputting the power supply voltage VDRV.

Note that, at time t62, the control IC 42 transitions from the "normal mode" to the "low-output mode". Further, the control IC 42 stops the operations of the oscillator circuit (OSC) 62 and the slope compensation circuit (SLOPE) 66 upon transitioning to the "low-output mode" and, when not driving the power transistor 40, stops the operation of the buffer circuit 81 as well, to thereby operate with low power consumption.

At time t63 at which the output voltage Vout drops and the feedback voltage Vfb reaches the reference voltage Vref-_stp, the comparator circuit 63 outputs the high signal stop_fb. In response to the comparator circuit 63 outputting the high signal stop_fb, the buffer circuit 81 resumes operating. Further, in this case, the regulator 68 resumes outputting the power supply voltage VDRV. Further, the driving signal output circuit 80 outputs the driving signal IN to drive the power transistor 40, and thus the buffer circuit 81 outputs the drive voltage Vg to drive the power transistor 40.

At time t64 at which the switch 30 is turned off, the target level of the output voltage Vout becomes the first level. The output voltage Vout results in being lower relative to the first level. Accordingly, the feedback voltage Vfb start to rise, and thus in association with a rise in the feedback voltage Vfb, the output voltage Vout and the power supply voltage Vcc start to rise.

At time t65 at which the power supply voltage Vcc exceeds the reference voltage VREF1, the control circuit 67 outputs the low signal opp_o. In response to the control circuit 67 outputting the low signal opp_o, the oscillator circuit 62 and the slope compensation circuit (SLOPE) 66 resume operating. Note that, at time t65, the control IC 42 transitions from the "low-output mode" to the "normal mode".

=====Other Embodiments of Control IC 42=====

Figure 15:
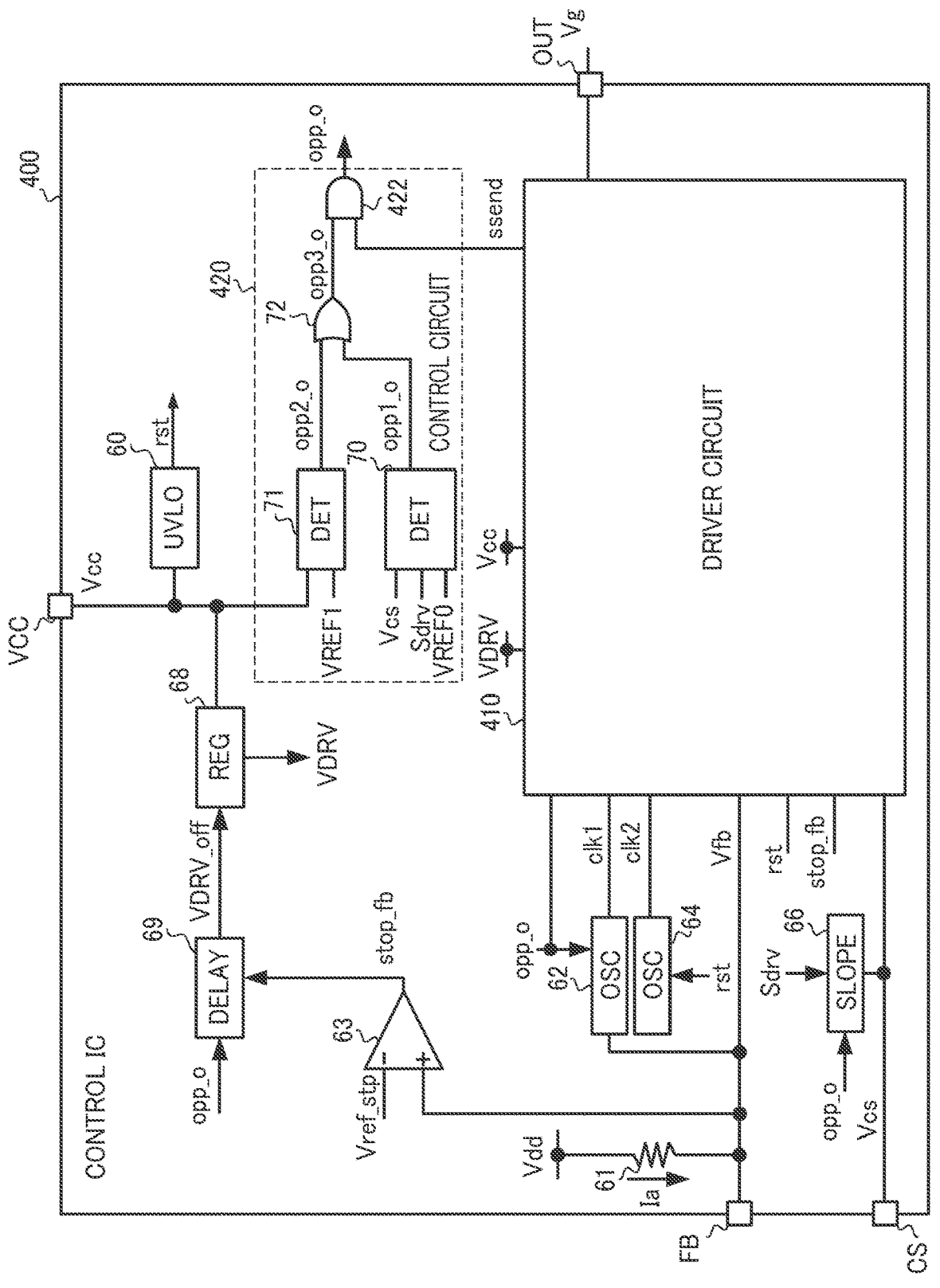
FIG. 15 is a diagram illustrating a configuration example of a control IC 400.

FIG. 15 is a diagram illustrating a configuration example of a control IC 400 which is a modification example of the control IC 42 of FIG. 2. Note that, in an embodiment of the present disclosure, the same or similar components may be given the same reference signs and redundant descriptions thereof may be omitted.

The control IC 42 of FIG. 2 described above detects that the target level of the output voltage Vout has been changed, based on the voltage Vcs at the terminal CS or the power supply voltage Vcc at the terminal VCC. However, at the startup of the AC-DC converter 10, the soft-start circuit 96 of FIG. 6 operates, and in this case, the ON period of the power transistor 40 gradually increases and the inductor current IL1 flowing through the primary coil L1 gradually increases.

Accordingly, the current flowing through the auxiliary coil L3 also gradually increases, and the output voltage Vout and the voltage Vcs when the power transistor 40 is off gradually rise. Thus, the voltage Vcs when the power transistor 40 is off may be lower than the reference voltage VREF0, or the output voltage Vout may be lower than the reference voltage VREF1. In this case, the control circuit 67 of FIG. 2 may output the high signal opp_o, and the control IC 42 may operate in the "low-output mode" at the startup of the AC-DC converter 10. In this case, a startup time may increase, and/or sufficient energy may not be supplied as an output.

Thus, in an embodiment of the present disclosure, a description will be given of an embodiment in which the control IC 400 is suppressed from operating in the "low-output mode" at the startup of the AC-DC converter 10.

<<<Configuration of Control IC 400>>>

The control IC 400 of FIG. 15 includes the under-voltage lockout circuit 60, the resistor 61, the oscillator circuits 62, 64, the comparator circuit 63, a driver circuit 410, the slope compensation circuit 66, a control circuit 420, the regulator 68, and the delay circuit 69.

==Driver Circuit 410==

Figure 16:
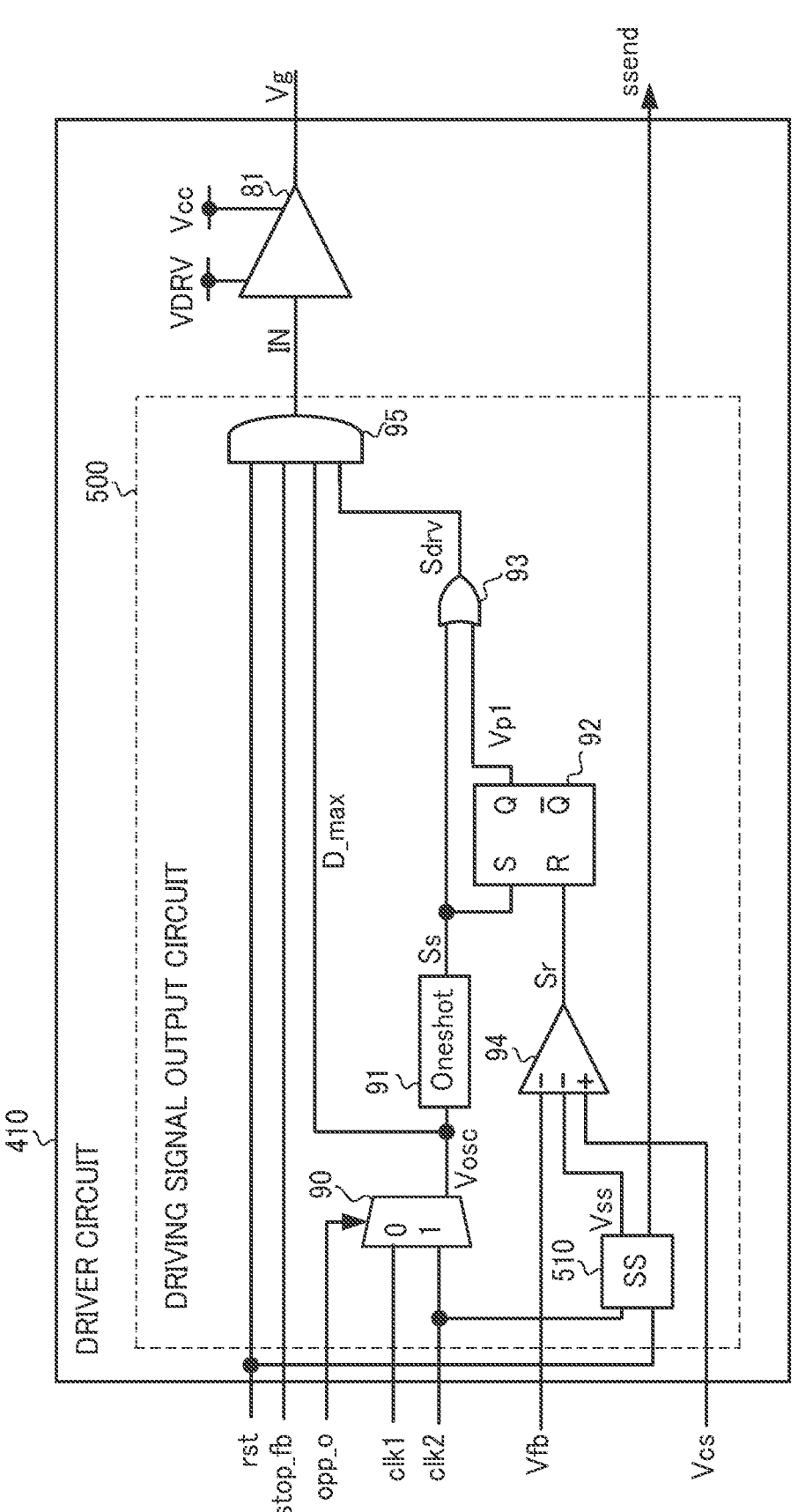
FIG. 16 is a diagram illustrating a configuration example of a driver circuit 410.

The driver circuit 410 of FIG. 15 is a modification example of the driver circuit 65 of FIG. 2, and when it is not at the startup of the AC-DC converter 10, in other words, when it is in the normal operation, the driver circuit 410 operates as with the driver circuit 65. The driver circuit 410 includes a driving signal output circuit 500 and the buffer circuit 81, as illustrated in FIG. 16.

Note that the phrase "in the normal operation" refers to when the control IC 400 operates such that the output voltage Vout is maintained at the first level or the second level according to the target level of the output voltage Vout determined by on/off of the switch 30. Further, the phrase "at the startup" refers to when the control IC 400 is operating so as to gradually raise the output voltage Vout from a predetermined voltage (e.g., ground voltage) to the first level or the second level, after the AC voltage Vac starts being applied to the AC-DC converter 10.

===Driving Signal Output Circuit 500===

The driving signal output circuit 500 is a modification example of the driving signal output circuit 80 of FIG. 6, and in the normal operation of the AC-DC converter 10, the driving signal output circuit 500 operates as with the driving signal output circuit 80. Further, the driving signal output circuit 500 includes the selector 90, the one-shot circuit 91, the SR flip-flop 92, the OR circuit 93, the comparator circuit 94, the AND circuit 95, and a soft-start circuit 510. Note that the signal Sr outputted by the comparator circuit 94 corresponds to a "result of comparison".

====Soft-Start Circuit 510====

The soft-start circuit (SS) 510 is a modification example of the soft-start circuit 96 of FIG. 6. The soft-start circuit 510 operates similarly to the soft-start circuit 96. However, the soft-start circuit 510 outputs the voltage Vss that rises in a stepwise manner after receiving the high signal rst from the under-voltage lockout circuit 60, and outputs a high signal ssend in response to an elapse of a predetermined time period P.

The soft-start circuit 510 includes a counter 512 and a digital-to-analog converter (DAC) 514. The counter 512 starts counting in response to the oscillator signal clk2, upon receiving the signal rst to release the reset of the control IC 400 from the under-voltage lockout circuit 60, to thereby measure the predetermined time period P while outputting a count value Count. Then, the counter 512 outputs the high signal ssend, in response to the predetermined time period P having elapsed since the receipt of the signal rst to release the reset.

Meanwhile, the counter 512 outputs a low signal ssend before the predetermined time period P having elapsed since the receipt of the signal rst to release the reset. Further, it is assumed that the counter 512 counts in response to the oscillator signal clk2, but may count in response to an oscillator signal obtained by frequency-dividing the oscillator signal clk2. Note that the count value Count corresponds to a "count result". Further, the first predetermined voltage corresponds to a "third predetermined level".

The digital-to-analog converter 514 outputs the voltage Vss that rises in a stepwise manner, based on the count value Count. The digital-to-analog converter 514 causes the voltage Vss to be a voltage (e.g., voltage Vdd) at least higher than the feedback voltage Vfb, in response to the predetermined time period P having elapsed since the receipt of the signal rst to reset the reset.

Hereinabove, it is assumed that the counter 512 measures the time period until the predetermined time period P has elapsed since the receipt of the signal rst to release the reset, and outputs the signal ssend. However, it may be assumed that a circuit using a capacitor and the like measures the predetermined time period P from when the signal rst to release the reset is received, to output the signal ssend.

Note that the counter 512 corresponds to a "timer circuit", the digital-to-analog converter 514 corresponds to a "voltage output circuit", and the voltage Vss corresponds to a "reference voltage". Further, the selector 90, the one-shot circuit 91, the SR flip-flop 92, the OR circuit 93, and the AND circuit 95 correspond to an "on/off circuit". Further, the under-voltage lockout circuit corresponds to a "third detection circuit".

==Control Circuit 420==

The control circuit 420 of FIG. 15 is a modification example of the control circuit 67 of FIG. 2, and, similarly to the control circuit 67, detects that the target level of the output voltage Vout has lowered from the first level to the second level, and controls the operations of various circuits of the control IC 42. Meanwhile, the control circuit 420 outputs the low signal opp_o at the startup of the AC-DC converter 10, so that the control IC 400 does not operate in the "low-output mode". The control circuit 420 includes the detection circuits 70, 71, the OR circuit 72, and an AND circuit 422.

===Detection Circuit 70===

In an embodiment described above, the detection circuit (DET) 70 is configured to output the low signal opp1_o to the OR circuit 72, in response to the voltage Vcs when the power transistor 40 is off exceeding the reference voltage VREF0. However, the detection circuit (DET) 70 may be configured to output the high signal opp1_o to the OR circuit 72, in response to the time period during which the voltage Vcs when the power transistor 40 is off is higher than the reference voltage VREF0 having continued for a predetermined time period tpa, when the control IC 400 of FIG. 15 transitions from the "low-output mode" to the "normal mode".

Figure 18:
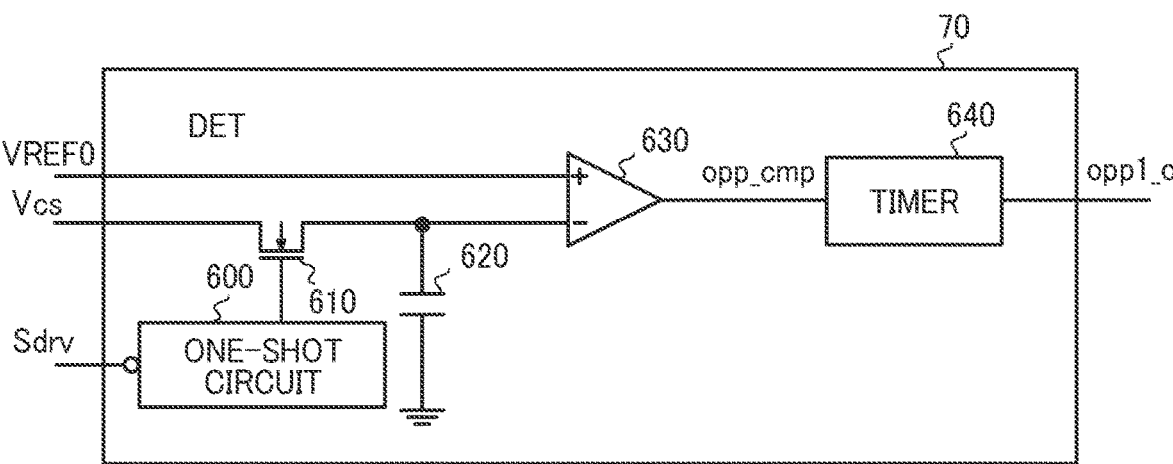
FIG. 18 is a diagram illustrating a configuration example of a detection circuit 70.

The detection circuit 70 includes, as illustrated in FIG. 18, a one-shot circuit 600, an NMOS transistor 610, a capacitor 620, a comparator circuit 630, and a timer 640.

The one-shot circuit 600 generates a pulse signal to turn on the NMOS transistor 610 at the falling edge of the signal Sdrv, when receiving the low signal Sdrv from the OR circuit 93 of FIG. 16.

The capacitor 620 receives the voltage corresponding to the voltage Vcs, upon turning on of the NMOS transistor 610. Meanwhile, the capacitor 620 holds the voltage corresponding to the voltage Vcs, upon turning off of the NMOS transistor 610.

The comparator circuit 630 compares the voltage at the capacitor 620 and the reference voltage VREF0, and, when the voltage at the capacitor 620 is lower than the reference voltage VREF0, outputs a high signal opp_cmp. Meanwhile, when the voltage at the capacitor 620 is higher than the reference voltage VREF0, the comparator circuit 630 outputs a low signal opp_cmp.

A timer 640 outputs the high signal opp1_o upon receiving the high signal opp_cmp for the predetermined time period tp. Meanwhile, the timer 640 outputs the low signal opp1_o upon receiving the low signal opp_cmp for the predetermined time period tpa.

===AND Circuit 422===

Further, the AND circuit 422 calculates the logical product of a signal opp3_o from the OR circuit 72 and the signal ssend from the soft-start circuit 510 of FIG. 16, to thereby output a resultant signal as the signal opp_o. At the startup of the AC-DC converter 10, the soft-start circuit 510 outputs the low signal ssend, and thus, for example, even if the OR circuit 72 outputs the high signal opp3_o, based on the output voltage Vout lower than the reference voltage VREF1, the signal opp_o outputted by the AND circuit 422 still remains low. Meanwhile, in the normal operation of the AC-DC converter 10, the soft-start circuit 510 outputs the high signal ssend, and thus the AND circuit 422 outputs the signal opp_o in response to the signal opp3_o from the OR circuit 72.

Figure 19:
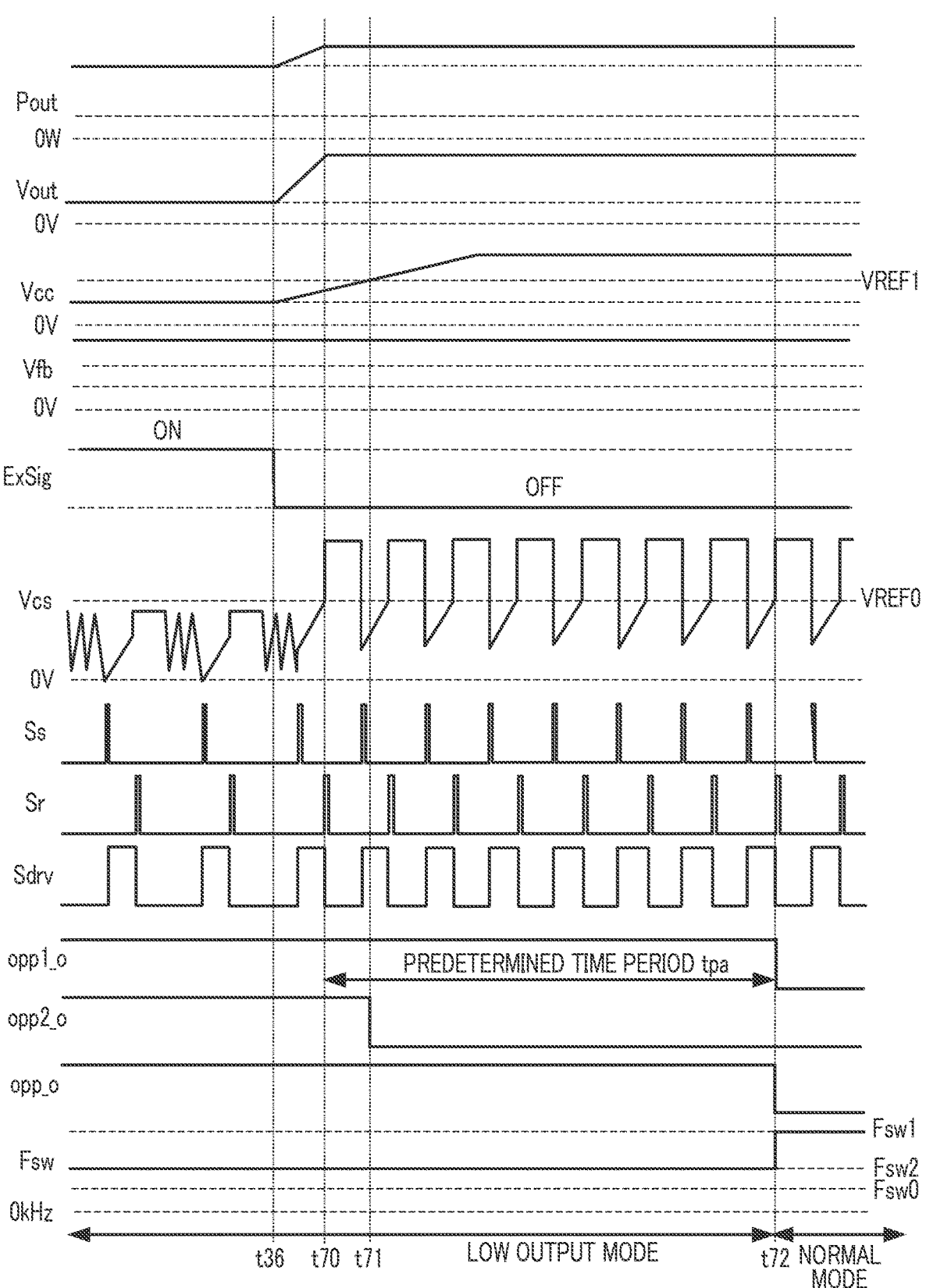
FIG. 19 is a chart illustrating an operation example of a control IC 400 when transitioning from a "low-output mode" to a "normal mode".

Further, the control circuit 420 may operate as illustrated in FIG. 19. FIG. 19 is a chart illustrating an operation of the control IC 400 when the AC-DC converter 10 is in the normal operation, and the operation of the control IC 400 before time t36 is the same as the operation of the control IC 42 in FIG. 10.

In response to the voltage Vcs when the power transistor 40 is off exceeding the reference voltage VREF0 after the switch 30 is turned off by the external signal ExSig, at time t70, the detection circuit 70 starts to count the predetermined time period tpa.

In response to the power supply voltage Vcc exceeding the reference voltage VREF1 at time t71, the detection circuit 71 outputs the low signal opp2_o.

At time t72 at which the predetermined time period tpa has elapsed since time t70, the detection circuit 70 outputs the low signal opp1_o. Accordingly, in this case, the OR circuit 72 outputs the low signal opp3_o. Further, the AND circuit 422 outputs the low signal opp_o.

From above, the detection circuit 70 detects that the voltage Vcs when the power transistor 40 is off is higher than the reference voltage VREF0 for the predetermined time period tpa, when the mode transitions from the "low-output mode" to the "normal mode". This makes it possible for the control IC 400 to reliably detect that the target level of the output voltage Vout reaches the first level.

Here, a description has been given such that the detection circuit 70 changes the signal opp1_o in response to an elapse of the predetermined time period tp, tpa. However, the detection circuit 70 may change the signal opp1_o, based on the number of times the voltage Vcs becomes higher or lower than the reference voltage VREF0.

<<<Operation of Control IC 400 at Startup of AC-DC Converter 10>>>

Figure 20:
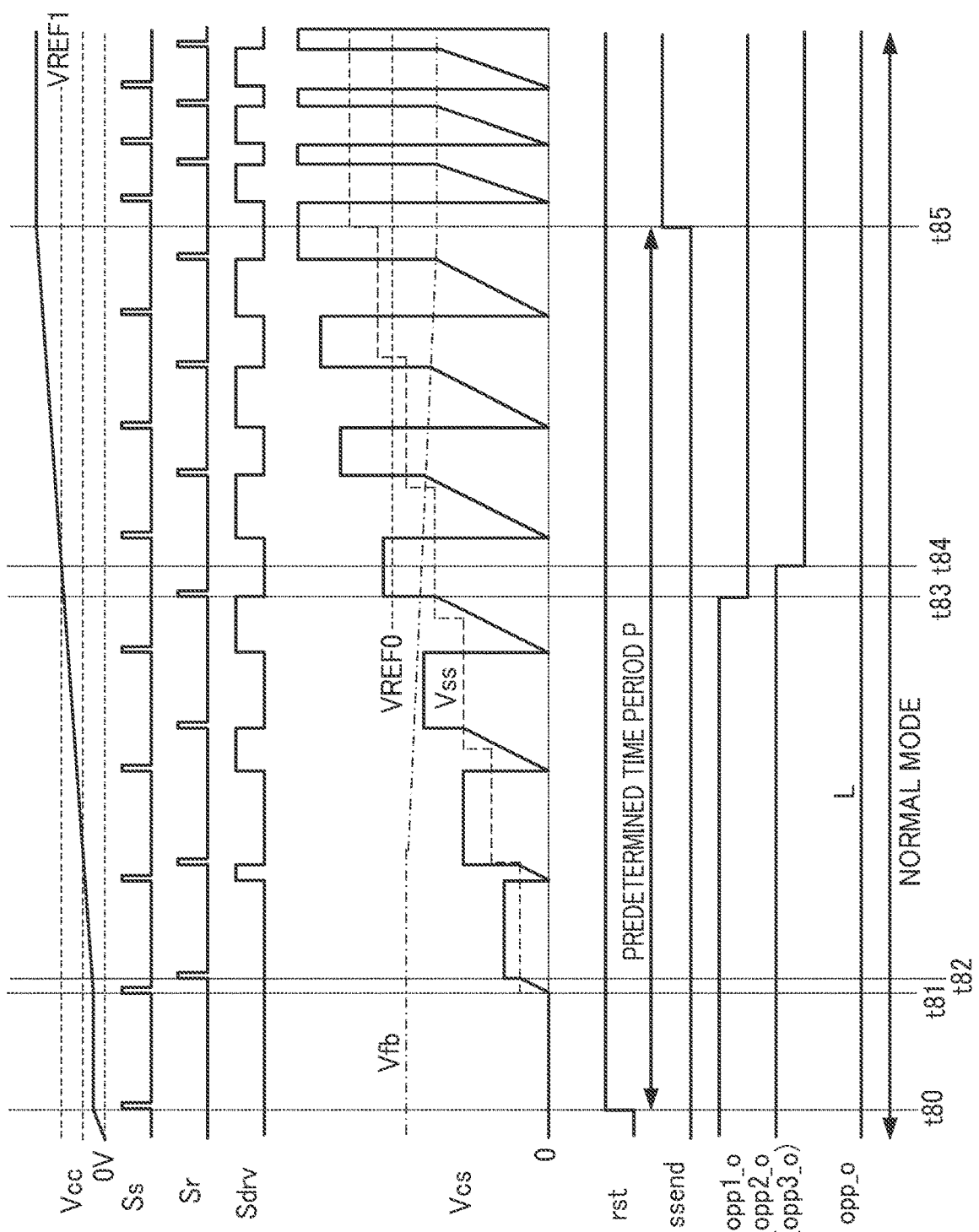
FIG. 20 is a chart illustrating an operation example of an AC-DC converter 10 at startup.

FIG. 20 is a chart illustrating an operation example of the AC-DC converter 10 at startup. It is assumed that the power supply voltage Vcc is raised to the first predetermined voltage by a startup circuit (not illustrated) before time t80. Further, in the explanation of FIG. 20, for convenience of explanation, it is assumed that the detection circuit 70 outputs the low signal opp1_o immediately in response to the voltage Vcs when the power transistor 40 is off exceeding the reference voltage VREF0.

At time t80 at which the power supply voltage Vcc reaches the first predetermined voltage, the under-voltage lockout circuit 60 of FIG. 15 outputs the high signal rst to release the reset of the control IC 400.

Figure 17:
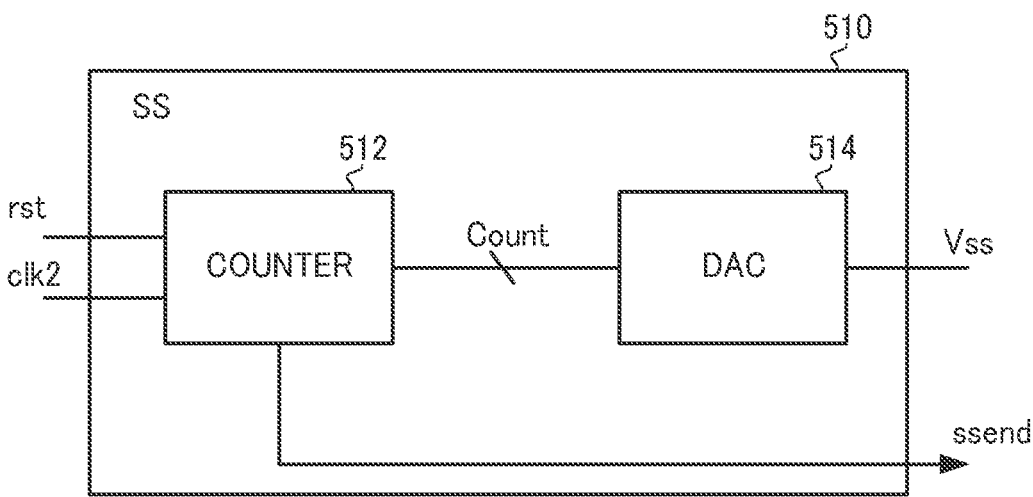
FIG. 17 is a diagram illustrating a configuration example of a soft start circuit 510.

In response to the under-voltage lockout circuit 60 outputting the high signal rst, the counter 512 of FIG. 17 outputs the low signal ssend. In response to the counter 512 outputting the low signal ssend, the control circuit 420 outputs the low signal opp_o. This causes the control IC 400 to continue to operate in the "normal mode", even if the detection circuits 70, 71 detect that the mode is the "low-output mode".

At time t81, the digital-to-analog converter 514 of FIG. 17 raises the voltage Vss from the ground voltage. Further, in response to the one-shot circuit 91 of FIG. 16 outputting the pulse signal Ss, in response to the oscillator signal clk1 from the oscillator circuit 62 of FIG. 15, the power transistor 40 of FIG. 1 is turned on.

At time t82 at which the power transistor 40 is turned on and the voltage Vcs reaches the voltage Vss, the voltage Vss is lower than the voltage Vfb, and thus the comparator circuit 94 of FIG. 16 outputs the high signal Sr. In response to the signal Sr going high, the OR circuit 93 outputs the low signal Sdrv. Upon receiving the low signal Sdrv, the AND circuit 95 outputs the low driving signal IN. Accordingly, the power transistor 40 of FIG. 1 is turned off.

At time t83 at which the voltage Vcs when the power transistor 40 is off exceeds the reference voltage VREF0, the detection circuit 70 outputs a low signal opp1_o.

Further, at time t84 at which the power supply voltage Vcc exceeds the reference voltage VREF1, the detection circuit 71 outputs the low signal opp2_o.

At time t85 at which the predetermined time period P has elapsed since the under-voltage lockout circuit 60 of FIG. 15 outputs the high signal rst, the counter 512 of FIG. 17 outputs the high signal ssend. Accordingly, the control IC 400 does not operate in the "low-output mode", even when the voltage Vcs when the power transistor 40 is off is lower than the reference voltage VREF0, or the power supply voltage Vcc is lower than the reference voltage VREF1, at the startup of the AC-DC converter 10.

<<About Operation of FIG. 7>>

It has been described, with reference to FIG. 7, that in response to the feedback voltage Vfb dropping below the reference voltage Vref_stp, the comparator circuit 63 outputs the low signal stop_fb, and the driver circuit 65 stops driving the power transistor 40. As such, by stopping or resuming the driving of the power transistor 40 according to the voltage value of the feedback voltage Vfb, the control IC 42 intermittently drives the power transistor 40, in response to a rise in the output voltage Vout, in other words, in response to the load of the motor 11 entering a light load condition.

Accordingly, the control IC 42 intermittently drives the power transistor 40 to implement a burst operation, in response to the load entering a light load condition, irrespective of it is in the "normal mode" or the "low-output mode".

Summary

Hereinabove, the AC-DC converter 10 according to an embodiment of the present disclosure has been described. The control IC 42 includes the oscillator circuits 62, 64, the driver circuit 65, and the control circuit 67. The control IC 42 stops the operation of the oscillator circuit 62, after the target level of the output voltage Vout is changed to the second level. This makes it possible to provide an integrated circuit capable of operating with low power consumption when the target level is lowered.

Further, the oscillator circuit 64 outputs the oscillator signal clk2 having 50% duty cycle. Accordingly, the control IC 42 can stop the operation of the slope compensation circuit 66 that suppresses the subharmonic oscillation, after the target level of the output voltage Vout is changed to the second level.

Further, the control IC 42 includes the terminal CS and the slope compensation circuit 66. The control IC 42 stops the operation of the slope compensation circuit 66, after the target level of the output voltage Vout is changed to the second level. Accordingly, the control IC 42 can operate with low power consumption when the target level is lowered.

Further, the control IC 42 includes the terminal VCC. The control circuit 67 includes the detection circuits 70, 71, and the OR circuit 72. Accordingly, the control circuit 67 can appropriately detect that the target level of the output voltage Vout becomes the second level, by virtue of change in the voltages at the terminals CS, VCC.

Further, the control IC 42 includes the comparator circuit 63. The driver circuit 65 includes the driving signal output circuit 80 and the buffer circuit 81. The control circuit 67 stops the operation of the buffer circuit 81, in response to the comparator circuit 63 detecting that the feedback voltage Vfb drops below the reference voltage Vref_stp, after the target level of the output voltage Vout is changed to the second level. Accordingly, the control IC 42 can detect that the target level of the output voltage Vout becomes the second level, as well as stop the operation of the buffer circuit 81 in the time period during which the power transistor is not driven, thereby being able to operate with low power consumption.

Further, the control IC 42 includes the terminal OUT configured to be pulled down by the resistors 41, 52. The buffer circuit 81 includes the power supply line PL, the level shifter circuit 201 including the NMOS transistor 216, and the drive voltage output circuit 202. Further, the NMOS transistor 216 is turned off after the target level of the output voltage Vout is changed to the second level, and is off in the time period during which the power transistor 40 is not driven. Accordingly, the control IC 42 can operate with low power consumption while causing the power transistor 40 to be off, since the level of the voltage at the terminal OUT is the ground level even if the operation of the buffer circuit 81 is stopped.

Further, the counter 512 measures the predetermined time period P, in response to the under-voltage lockout circuit 60 outputting the high signal rst. The control circuit 420 causes the signal opp_o to be low in response to the signal ssend from the counter 512, at the startup of the AC-DC converter

10. Thus, the control circuit 420 does not stop the operation of the oscillator circuit 62, after an elapse of the predetermined time period P as well as until the target level of the output voltage Vout is changed to the second level. Accordingly, the control IC 400 does not operate in the "low-output mode" even if the voltage Vcs and/or the power supply voltage Vcc are low, at the startup of the AC-DC converter 10. Further, the driver circuit 410 includes the digital-to-analog converter 514, the comparator circuit 94, the selector 90, the one-shot circuit 91, the SR flip-flop 92, the OR circuit 93, and the AND circuit 95. The comparator circuit 94 compares either the feedback voltage Vfb or the voltage Vss from the digital-to-analog converter 514 with the voltage Vcs. At the startup of the AC-DC converter 10, the control IC 400 changes the on-width of the power transistor 40 according to a change in the voltage Vss, to gradually change the output voltage Vout. Accordingly, the control IC 400 does not operate in the "low-output mode" until the output voltage Vout reaches the target level.

Further, the digital-to-analog converter 514 outputs the voltage Vss that rises in a stepwise manner based on the count value Count from the counter 512, and the comparator circuit 94 compares the lower one of the voltage Vss or the voltage Vfb with the voltage Vcs. Accordingly, the control IC 400 can gradually raise the output voltage Vout, at the startup of the AC-DC converter 10.

Further, the control IC 42 includes the comparator circuit 63, the oscillator circuits 62, 64, the driving signal output circuit 80, the buffer circuit 81, and the control circuit 67. Accordingly, the control IC 42 can stop the operation of the buffer circuit 81 after the target level of the output voltage Vout is changed to the second level as well as in the time period during which the power transistor 40 is not driven, thereby being able to operate with low power consumption.

The present disclosure is directed to provision of an integrated circuit capable of operating with low power consumption when the target level of the output voltage thereof is lowered.

According to the present disclosure, it is possible to provide an integrated circuit capable of operating with low power consumption when the target level of the output voltage thereof is lowered.

Embodiments of the present disclosure described above are simply to facilitate understanding of the present disclosure and are not in any way to be construed as limiting the present disclosure. The present disclosure may variously be changed or altered without departing from its essential features and encompass equivalents thereof.

What is claimed is:

1. An integrated circuit for a power supply circuit configured to generate an output voltage of a target level from an input voltage thereof, the target level being changeable between a first level and a second level lower than the first level, the power supply circuit including
    a transformer including a primary coil, a secondary coil, and an auxiliary coil, and
    a first transistor configured to control a current flowing through the primary coil, the integrated circuit being configured to drive the first transistor, the integrated circuit comprising:
        a first oscillator circuit configured to output a first oscillator signal having a first frequency corresponding to the output voltage;
        a second oscillator circuit configured to output a second oscillator signal having a predetermined second frequency;

a feedback voltage generating circuit configured to generate a feedback voltage according to the output voltage;

a driver circuit configured to drive the first transistor in response to the first oscillator signal, when the target level of the output voltage is the first level and the feedback voltage fluctuates in a first voltage value range, and drive the first transistor in response to the second oscillator signal, when the target level is the second level and the feedback voltage fluctuates in a second voltage value range; and a control circuit configured to stop an operation of the first oscillator circuit, after the target level is changed to the second level, wherein the first voltage value range and the second voltage value range overlap each other; and the driver circuit is further configured to drive the first transistor in response to the first oscillator, when the target level of the output voltage is the first level in both a first period in which the feedback voltage increases and a second period in which the feedback voltage decreases.

2. The integrated circuit according to claim 1, wherein the integrated circuit further includes a sense circuit that detects whether the target level is at the first level or the second level, the sense circuit includes:

a first detection circuit comparing a first predetermined level with a power supply voltage of the integrated circuit, and a second detection circuit comparing a second predetermined level with a current value of a first current which flows in the first transistor, and the sense circuit detects the target level according to a first comparison result of the first detection circuit and a second comparison result of the second detection circuit.

3. The integrated circuit according to claim 1, wherein the second oscillator signal outputted from the second oscillator circuit has a duty cycle of 50% or less, the duty cycle being determined by a time period for turning on the first transistor relative to a period of the second oscillator signal.

4. The integrated circuit according to claim 3, wherein the power supply circuit further includes a first resistor configured to detect a current flowing through the first transistor when the first transistor is on; and the integrated circuit further includes:

a first terminal to which the first resistor is coupled, the first terminal having a first voltage that is based on the first resistor and the current flowing through the first transistor, and a slope compensation circuit configured to generate a second voltage to compensate the first voltage, wherein the first oscillator signal outputted from the first oscillator circuit has another duty cycle greater than 50%, said another duty cycle being determined by the time period for turning on the first transistor relative to a period of the first oscillator signal, the driver circuit turns on the first transistor in response to the first oscillator signal or the second oscillator signal, and turns off the first transistor in response to the first voltage or the second voltage reaching a voltage corresponding to the output voltage, and the control circuit stops an operation of the slope compensation circuit, after the target level is changed to the second level.

5. The integrated circuit according to claim 4, further comprising a second terminal configured to receive a power supply voltage corresponding to a coil voltage of the auxiliary coil, wherein the first terminal receives a voltage corresponding to the coil voltage when the first transistor is off, and the control circuit includes a first detection circuit configured to detect whether the voltage at the first terminal when the first transistor is off is lower than a first predetermined level, a second detection circuit configured to detect whether the power supply voltage at the second terminal is lower than a second predetermined level, and a circuit configured to control the operations of the first oscillator circuit and the slope compensation circuit, based on results of detections of the first detection circuit and the second detection circuit.

6. The integrated circuit according to claim 1, further comprising a determination circuit configured to determine whether driving of the first transistor is to be stopped, based on the output voltage, wherein the driver circuit includes a driving signal output circuit configured to output a driving signal to turn on the first transistor, in response to the first oscillator signal or the second oscillator signal, and output the driving signal to turn off the first transistor, in response to a voltage corresponding to a current flowing through the first transistor when the first transistor is on reaching a voltage corresponding to the output voltage, and a buffer circuit configured to stop driving of the first transistor, in response to an output from the determination circuit indicating that the driving of the first transistor is to be stopped, and drive the first transistor based on the driving signal, in response to the output from the determination circuit indicating that the driving of the first transistor is not to be stopped; and the control circuit stops an operation of the buffer circuit, in response to the determination circuit determining that the driving of the first transistor is stopped, after the target level is changed to the second level.

7. The integrated circuit according to claim 6, the power supply circuit further includes a second resistor having a first end and a second end, the second end being grounded; and the integrated circuit further includes a third terminal, the third terminal being coupled to a control electrode of the first transistor and the first end of the second resistor, wherein the buffer circuit includes a power supply line configured to receive a voltage to turn on the first transistor, a level shifter circuit including a second transistor, the second transistor being configured to output a level-shift signal to turn off the first transistor, upon being turned on in response to the driving signal to turn off the first transistor, output the level-shift signal to turn on the first transistor, upon being turned off in response to the driving signal to turn on the first transistor, and a drive voltage output circuit configured to output, to the third terminal, a drive voltage to be applied to the control electrode of the first transistor, in response to the level-shift signal, wherein the second transistor outputs the level-shift signal to turn off the first transistor while passing a current from the power supply line to a ground, and is turned off, in response to the determination circuit determining that the driving of the first transistor is stopped, after the target level is changed to the second level.

8. The integrated circuit according to claim 1, further comprising:

a third detection circuit configured to detect whether a power supply voltage of the integrated circuit is higher than a third predetermined level, and a timer circuit configured to measure a predetermined time period, in response to the power supply voltage exceeding the third predetermined level, wherein the control circuit stops the operation of the first oscillator circuit, in response to an elapse of the predetermined time period and to the target level being changed to the second level.

9. The integrated circuit according to claim 8, wherein the driver circuit includes a voltage output circuit configured to output a reference voltage that changes in response to the power supply voltage exceeding the third predetermined level, a comparator circuit configured to compare either the reference voltage or a voltage corresponding to the output voltage with a voltage corresponding to a current flowing through the first transistor, and an on/off circuit configured to turn on the first transistor, based on the first oscillator signal or the second oscillator signal, and turn off the first transistor, based on a result of comparison of the comparator circuit.

10. The integrated circuit according to claim 9, wherein the timer circuit is a counter configured to count the predetermined time period, based on the second oscillator signal, in response to the power supply voltage exceeding the third predetermined level, the voltage output circuit outputs the reference voltage that rises in a stepwise manner based on a count result of the counter, and the comparator circuit compares a lower one between the reference voltage and the voltage corresponding to the output voltage with the voltage corresponding to the current flowing through the first transistor.

11. A power supply circuit configured to generate an output voltage from an input voltage thereof, the power supply circuit comprising:

a transformer including a primary coil, a secondary coil, and an auxiliary coil;

a first transistor configured to control a current flowing through the primary coil; and an integrated circuit configured to drive the first transistor and to perform control such that the output voltage reaches a target level, the target level being changeable between a first level and a second level lower than the first level, the integrated circuit including a determination circuit configured to determine whether driving of the first transistor is stopped, based on the output voltage, an oscillator circuit configured to output an oscillator signal, a driving signal output circuit configured to output a driving signal to turn on the first transistor in response to the oscillator signal, and output the driving signal to turn off the first transistor, in response to a voltage corresponding to a current flowing through the first transistor when the first transistor is on reaching a voltage corresponding to the output voltage, a buffer circuit configured to, after a delay of a predetermined time, stop the driving of the first transistor, in response to an output from the determination circuit indicating that the driving of the first transistor is to be stopped, and drive the first transistor, based on the driving signal, in response to the output from the determination circuit indicating that the driving of the first transistor is not to be stopped; and a control circuit configured to operate the buffer circuit, after the target level is changed to the first level, and stop an operation of the buffer circuit, in response to the determination circuit determining that the driving of the first transistor is stopped, after the target level is changed to the second level.

12. A power supply circuit configured to generate an output voltage from an input voltage thereof, the power supply circuit comprising:

a transformer including a primary coil, a secondary coil, and an auxiliary coil;

a first transistor configured to control a current flowing through the primary coil; and an integrated circuit configured to drive the first transistor and to perform control such that the output voltage reaches a target level, the target level being changeable between a first level and a second level lower than the first level, the integrated circuit including a first oscillator circuit configured to output a first oscillator signal having a first frequency corresponding to the output voltage, a second oscillator circuit configured to output a second oscillator signal having a predetermined second frequency, a feedback voltage generating circuit configured to generate a feedback voltage according to the output voltage, a driver circuit configured to drive the first transistor in response to the first oscillator signal, when the target level of the output voltage is the first level and the feedback voltage fluctuates in a first voltage value range, and drive the first transistor in response to the second oscillator signal, when the target level is the second level and the feedback voltage fluctuates in a second voltage value range, and a control circuit configured to stop an operation of the first oscillator circuit, after the target level is changed to the second level, wherein the first voltage value range and the second voltage value range overlap each other, and the driver circuit is further configured to drive the first transistor in response to the first oscillator, when the target level of the output voltage is the first level in both a first period in which the feedback voltage increases and a second period in which the feedback voltage decreases.

13. The power supply circuit according to claim 12, wherein the integrated circuit further includes a sense circuit that detects whether the target level is at the first level or the second level, the sense circuit includes:

a first detection circuit comparing a first predetermined level with a power supply voltage of the integrated circuit, and a second detection circuit comparing a second predetermined level with a current value of a first current which flows in the first transistor, and the sense circuit detects the target level according to a first comparison result of the first detection circuit and a second comparison result of the second detection circuit.

14. An integrated circuit for a power supply circuit configured to generate an output voltage of a target level from an input voltage thereof, the target level being changeable between a first level and a second level lower than the first level, the power supply circuit including a transformer including a primary coil, a secondary coil, and an auxiliary coil, and a first transistor configured to control a current flowing through the primary coil, the integrated circuit being configured to drive the first transistor, the integrated circuit comprising:

a determination circuit configured to determine whether driving of the first transistor is to be stopped, based on the output voltage;

an oscillator circuit configured to output an oscillator signal;

a driving signal output circuit configured to output a driving signal to turn on the first transistor in response to the oscillator signal, and output the driving signal to turn off the first transistor, in response to a voltage corresponding to a current flowing through the first transistor when the first transistor is on reaching a voltage corresponding to the output voltage;

a buffer circuit configured to, after a delay of a predetermined time, stop the driving of the first transistor, in response to an output from the determination circuit indicating that the driving of the first transistor is to be stopped, and drive the first transistor, based on the driving signal, in response to the output from the determination circuit indicating that the driving of the first transistor is not to be stopped; and a control circuit configured to operate the buffer circuit after the target level is changed to the first level, and stop an operation of the buffer circuit, in response to the determination circuit determining that the driving of the first transistor is stopped, after the target level is changed to the second level.

15. The integrated circuit according to claim 14, the power supply circuit further includes a second resistor having a first end and a second end, the second end being grounded; and the integrated circuit further includes a terminal that is coupled to a control electrode of the first transistor and the first end of the second resistor, wherein the buffer circuit includes a power supply line configured to receive a voltage to turn on the first transistor, a level shifter circuit including a second transistor, the second transistor being configured to output a level-shift signal to turn off the first transistor, upon being turned on in response to the driving signal to turn off the first transistor, output the level-shift signal to turn on the first transistor, upon being turned off in response to the driving signal to turn on the first transistor, and a drive voltage output circuit configured to output, to the terminal, a drive voltage to be applied to the control electrode of the first transistor, in response to the level-shift signal, wherein the second transistor outputs the level-shift signal to turn off the first transistor while passing a current from the power supply line to a ground, and is turned off, in response to the determination circuit determining that the driving of the first transistor is stopped, after the target level is changed to the second level.

* * * * *